(12) United States Patent
Ji et al.

(10) Patent No.: US 9,070,729 B2
(45) Date of Patent: Jun. 30, 2015

(54) WAFER PROCESSING METHOD AND METHOD OF MANUFACTURING SEMICONDUCTOR DEVICE BY USING THE SAME

(71) Applicant: Samsung Electronics Co., Ltd., Suwon-si (KR)

(72) Inventors: Sang-wook Ji, Seoul (KR); Hyoung-yol Mun, Yongin-si (KR); Yeong-Iyeol Park, Yongin-si (KR); Tae-je Cho, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/497,382

(22) Filed: Sep. 26, 2014

(65) Prior Publication Data

US 2015/0093880 A1 Apr. 2, 2015

(30) Foreign Application Priority Data

Sep. 30, 2013 (KR) .................. 10-2013-0116458

(51) Int. Cl.
*H01L 21/683* (2006.01)
*H01L 21/304* (2006.01)
*H01L 21/02* (2006.01)
*H01L 21/768* (2006.01)

(52) U.S. Cl.
CPC .......... *H01L 21/6835* (2013.01); *H01L 21/304* (2013.01); *H01L 21/768* (2013.01); *H01L 21/02013* (2013.01); *H01L 21/76898* (2013.01); *H01L 21/02016* (2013.01)

(58) Field of Classification Search
CPC .................. H01L 21/02002; H01L 21/02013; H01L 21/02016; H01L 21/304; H01L 21/463; H01L 21/67092; H01L 21/6835; H01L 21/76898

See application file for complete search history.

(56) References Cited

U.S. PATENT DOCUMENTS

| | | |
|---|---|---|
| 3,986,255 A | 10/1976 | Mandal |
| 6,142,361 A | 11/2000 | Downes, Jr. et al. |
| 6,186,392 B1 | 2/2001 | Ball |
| 6,251,767 B1 | 6/2001 | Heinen |
| 6,283,358 B1 | 9/2001 | Ball |
| 7,432,114 B2 | 10/2008 | Teshirogi et al. |
| 7,902,060 B2 | 3/2011 | Swaminathan |
| 7,948,385 B2 | 5/2011 | Potyrailo et al. |
| 8,138,868 B2 | 3/2012 | Arnold |
| 8,446,014 B2 | 5/2013 | Ding et al. |
| 2009/0166873 A1 | 7/2009 | Yang et al. |

FOREIGN PATENT DOCUMENTS

KR 1020110131702 A 12/2011

*Primary Examiner* — Thanhha Pham
(74) *Attorney, Agent, or Firm* — Myers Bigel Sibley & Sajovec, PA

(57) ABSTRACT

A wafer processing method, by which a device wafer may be aligned and bonded to a carrier wafer to perform a back grinding process for the device wafer and may be separated from the carrier wafer after performing the back grinding process, and a method of manufacturing a semiconductor device by using the wafer processing method are provided. The wafer processing method includes: disposing a first magnetic material on a front side of a wafer and disposing a second magnetic material on a carrier wafer, wherein a surface of the first magnetic material and a surface of the second magnetic material, which face each other, have opposite polarities; aligning and bonding the wafer to the carrier wafer by magnetic attraction between the first magnetic material and the second magnetic material; grinding a back side of the wafer to make the wafer thin; and separating the wafer from the carrier wafer.

20 Claims, 16 Drawing Sheets

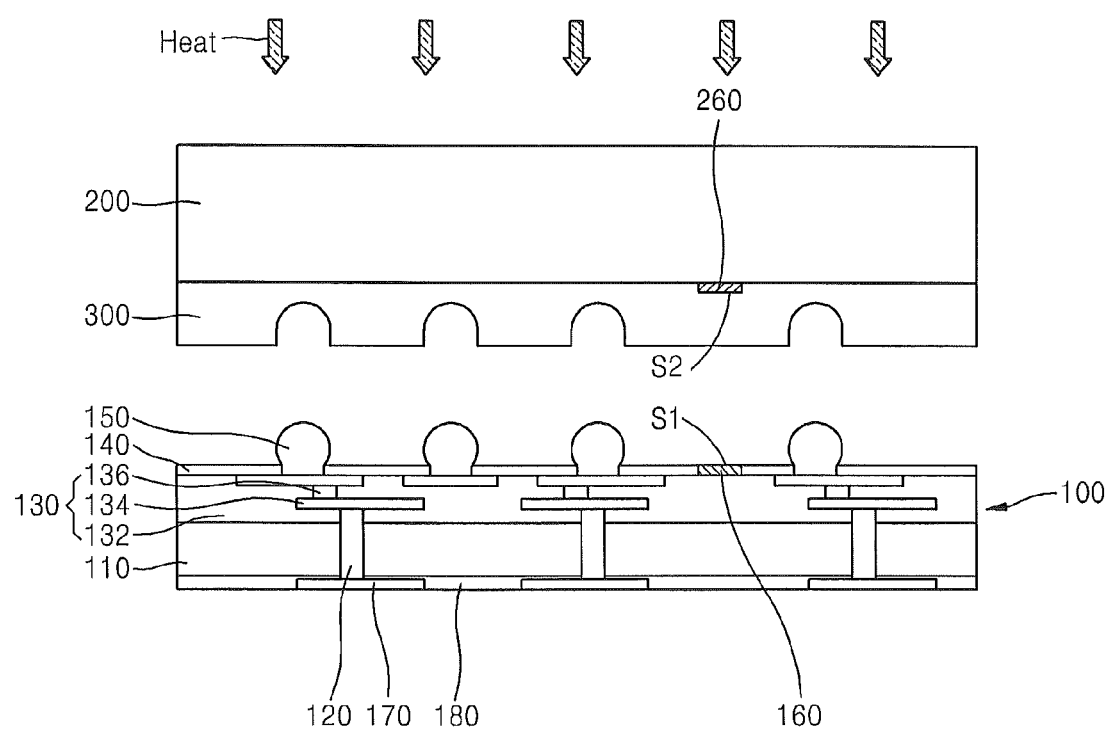

WAFER PROCESSING METHOD AND METHOD OF MANUFACTURING SEMICONDUCTOR DEVICE BY USING THE SAME

CROSS-REFERENCE TO RELATED APPLICATIONS

This application claims the benefit of Korean Patent Application No. 10-2013-0116458, filed on Sep. 30, 2013, in the Korean Intellectual Property Office, the disclosure of which is incorporated by reference herein in its entirety.

FIELD

The inventive concept relates to a wafer processing method, and more particularly, to a method of manufacturing a semiconductor device, in which a device wafer is bonded to a carrier wafer and is separated from the carrier wafer after making the device wafer thin by using a back grinding process.

BACKGROUND

Recently, portable electronic devices, such as a mobile phone, a portable multimedia player (PMP), and the like, require high functionality, small size, light weight, and low cost. In particular, to have the small size and light weight, a backlap or back grinding process that makes a wafer very thin is performed in a semiconductor package manufacturing process including a wafer bonding process. The back grinding process is a process that grinds some of the back side of a wafer, in which a pattern is not formed, by using a laser, chemical, and/or mechanical grinding method. After performing the back grinding process, subsequent processes, such as a circuit substrate attachment process, an electrical connection process, an encapsulation process, an input and output terminal forming process, and a sawing process, are performed to complete a semiconductor package.

SUMMARY

The inventive concept provides a wafer processing method by which a device wafer may be accurately aligned and bonded to a carrier wafer to perform a back grinding process for the device wafer and may be easily separated from the carrier wafer after performing the back grinding process.

The inventive concept also provides a method of manufacturing a semiconductor device by using the wafer processing method.

According to an aspect of the inventive concept, there is provided a wafer processing method including: disposing a first magnetic material on a front side of a wafer and disposing a second magnetic material on a carrier wafer, wherein an outwardly facing surface of the first magnetic material and an outwardly facing surface of the second magnetic material have opposite polarities; positioning the wafer and the carrier wafer relative to one another such that the outwardly facing surface of the first magnetic material faces the outwardly facing surface of the second magnetic material; aligning and bonding the wafer to the carrier wafer by magnetic attraction between the first magnetic material and the second magnetic material; grinding a back side of the wafer to make the wafer thin; and separating the wafer from the carrier wafer.

The wafer may include a through silicon via (TSV), and the grinding of the back side may include exposing the TSV at the back side of the wafer.

The wafer may include a through silicon via (TSV), and the TSV may be insulated from a silicon layer of the wafer via an insulating layer. The grinding of the back side of the wafer may include: removing a portion of the back side of the wafer by using chemical mechanical polishing (CMP); etching the back side of the wafer to expose the insulating layer; forming a protective layer on the back side of the wafer to cover the insulating layer; and removing the protective layer and the insulating layer by using CMP to expose the TSV.

The separating of the wafer may include separating the wafer from the carrier wafer by using a magnetic repulsive force that is generated by applying a magnetic field having the same polarity as the polarity of any one of the outwardly facing surfaces of the first and second magnetic materials.

The separating of the wafer may include heating the wafer and the carrier wafer above a temperature for removing a magnetism of at least one of the first and second magnetic materials.

The first magnetic material may be disposed on a first portion of the wafer in which effective chips are not disposed, and the second magnetic material may be disposed on a first portion of the carrier wafer which corresponds to the first portion of the wafer.

The first portion of the wafer may include at least one of a scribe lane, a notch, a flat-zone, and an edge portion of the wafer, the first magnetic material may include a plurality of magnetic materials that are disposed in the first portion of the wafer, and the second magnetic material may include a plurality of magnetic materials that are disposed in the first portion of the carrier wafer, wherein the number of plurality of magnetic materials of the first magnetic material is the same as that of the plurality of magnetic materials of the second magnetic material.

The wafer may include a through silicon via (TSV), the grinding of the back side may include exposing the TSV, and the wafer processing method may further include forming a redistribution line, which is connected to the TSV, before the separating of the wafer.

Before the disposing of the first and second magnetic materials, the wafer processing method may further include forming a through silicon via (TSV) in the wafer and disposing an external connection terminal, which is connected to the TSV, on a front side of the wafer, and the aligning and bonding of the wafer may include bonding the wafer to the carrier wafer by using the magnetic attraction and an adhesive member covering the external connection terminal.

The forming of the TSV may include forming the TSV by using any one of a via first process, a via middle process, and a via last process.

The first and second magnetic materials may be formed of at least one of a ferromagnetic material, a paramagnetic material, and a ferromagnetic material.

The first magnetic material may be disposed in a crack stop area or a chamfer area in an effective chip of the wafer.

According to another aspect of the inventive concept, there is provided a method of manufacturing a semiconductor device, the method including: forming a through silicon via (TSV) in a wafer; disposing an external connection terminal, which is connected to the TSV, on a front side of the wafer; disposing a first magnetic material on the front side of the wafer and disposing a second magnetic material on a carrier wafer, wherein an outwardly facing surface of the first magnetic material and an outwardly facing surface of the second magnetic material have opposite polarities; positioning the wafer and the carrier wafer relative to one another such that the outwardly facing surface of the first magnetic material faces the outwardly facing surface of the second magnetic material; aligning and bonding the wafer to the carrier wafer by using an adhesive member covering the external connection terminal and a magnetic attraction between the first magnetic material and the second magnetic material; grinding a back side of the wafer to make the wafer thin and to expose the TSV; forming a redistribution line, which is connected to the TSV, on the back side of the wafer; separating the wafer from the carrier wafer; and dividing the wafer into a plurality of semiconductor devices.

The first magnetic material may be disposed in any one of a scribe lane of the wafer, a notch of the wafer, a flat-zone of the wafer, and an edge portion of the wafer, and may be removed in the dividing of the wafer into the plurality of semiconductor devices.

The separating of the wafer may include separating the wafer from the carrier wafer by using a magnetic repulsive force, which is generated by applying a magnetic field having the same polarity as the polarity of any one of the surfaces of the first and second magnetic materials which face each other, or heating the wafer and the carrier wafer above a temperature for removing a magnetism of at least one of the first and second magnetic materials.

According to another aspect of the inventive concept, there is provided a wafer processing method. The method includes providing: a wafer having a through silicon via (TSV), the wafer including at least one first magnetic member on a front side of the wafer, the first magnetic member having an outwardly facing surface having a polarity; and a carrier wafer including at least one second magnetic member on a front side of the carrier wafer, the second magnetic member having an outwardly facing surface having a polarity that is opposite the polarity of the outwardly facing surface of the first magnetic member. The method includes: positioning the wafer and the carrier wafer relative to one another such that the front side of the wafer faces the front side of the carrier wafer; aligning and bonding the wafer to the carrier wafer by magnetic attraction between the first magnetic member and the second magnetic member; grinding a back side of the wafer to remove a portion of the wafer and to expose the TSV; and then separating the wafer from the carrier wafer.

The wafer may have a plurality of first magnetic members and the carrier wafer may have a plurality of second magnetic members. Aligning and bonding the wafer to the carrier wafer may include aligning and bonding the wafer to the carrier wafer by magnetic attraction between corresponding ones of the first magnetic members and the second magnetic members.

Separating the wafer from the carrier wafer may include separating the wafer from the carrier wafer using a magnetic repulsive force, which is generated by applying a magnetic field having the same polarity as the polarity of one of the outwardly facing surfaces of the first and second magnetic members.

Separating the wafer from the carrier wafer may include heating the wafer and the carrier wafer above a temperature for removing a magnetism of at least one of the first and second magnetic materials.

Aligning and bonding the wafer to the carrier wafer may include using an adhesive member that is positioned between the front side of the wafer and the front side of the carrier wafer.

BRIEF DESCRIPTION OF THE DRAWINGS

Exemplary embodiments of the inventive concept will be more clearly understood from the following detailed description taken in conjunction with the accompanying drawings in which:

FIG. 9 is a cross-sectional view illustrating a process of separating a device wafer from a carrier wafer, according to an embodiment of the inventive concept;

DETAILED DESCRIPTION OF THE EMBODIMENTS

Figure 1A:
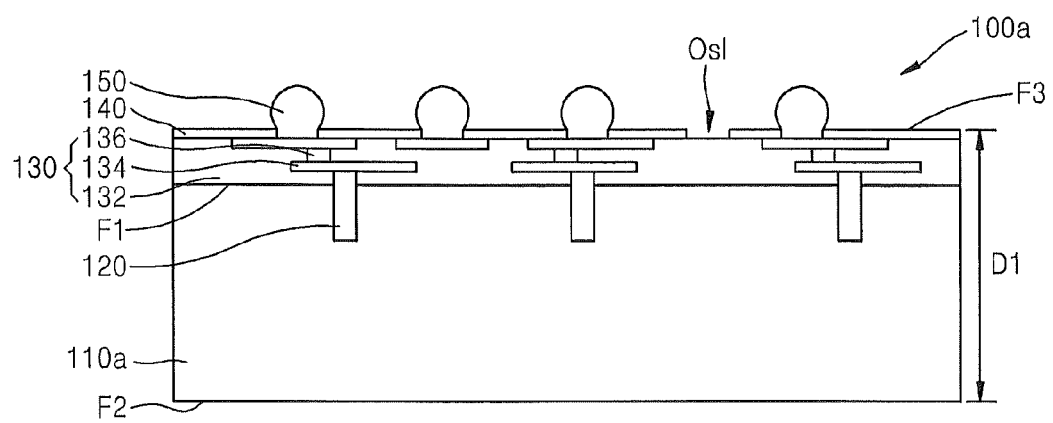
FIGS. 1A through 1G are cross-sectional views illustrating a method of manufacturing a semiconductor device, according to an embodiment of the inventive concept.

Hereinafter, the inventive concept will be described more fully with reference to the accompanying drawings, in which exemplary embodiments of the invention are shown. This inventive concept may, however, be embodied in many different forms and should not be construed as limited to the exemplary embodiments set forth herein. Rather, these embodiments are provided so that this disclosure will be thorough and complete, and will fully convey the scope of the inventive concept to those of ordinary skill in the art.

Throughout the specification, it will be understood that when an element is referred to as being "connected to" another element, it can be directly connected to the other element, or intervening elements may also be present. Similarly, it will also be understood that when an element is referred to as being "on" another element, it can be directly on the other element, or intervening elements may also be present. Also, in the drawings, the structures or sizes of the elements may be exaggerated for clarity, and redundant descriptions thereof may be omitted. Like reference numerals denote like elements in the drawings. The terms used herein are for illustrative purpose of the present inventive concept only and should not be construed to limit the meaning or the scope of the present inventive concept as described in the claims.

As used herein, the term "and/or" includes any and all combinations of one or more of the associated listed items.

In addition, spatially relative terms, such as "under", "below", "lower", "over", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "under" or "beneath" other elements or features would then be oriented "over" the other elements or features. Thus, the exemplary term "under" can encompass both an orientation of over and under. The device may be otherwise oriented (rotated 90 degrees or at other orientations) and the spatially relative descriptors used herein interpreted accordingly.

FIGS. 1A through 1G are cross-sectional views illustrating a method of manufacturing a semiconductor device, according to an embodiment of the inventive concept.

Referring to FIG. 1A, first, a plurality of through silicon vias (TSVs) 120 are formed in a body layer 110a of a device wafer 100a. The TSVs 120 may be formed by using a via first process, a via middle process, or a via last process.

The via first process is a process in which TSVs are formed before forming a integrated circuit layer, the via middle process is a process in which TSVs are formed before forming a wiring layer after forming an integrated circuit layer, and the via last process is a process in which TSVs are formed after forming a wiring layer.

Figure 3A:
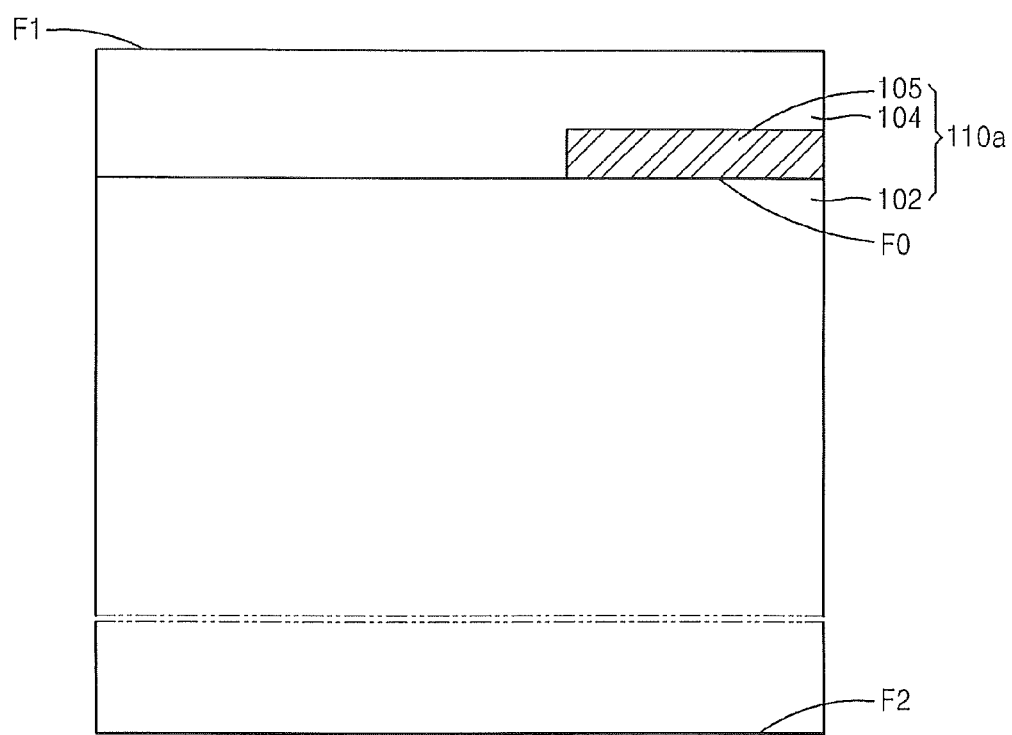
FIGS. 3A through 3D are cross-sectional views illustrating, in more detail, processes that are performed until an external connection terminal of FIG. 1A is formed.

As shown in FIG. 3A, the body layer 110a may include a semiconductor substrate 102 and an interlayer insulating layer 104. The semiconductor substrate 102 may be, for example, a silicon substrate. However, the semiconductor substrate 102 is not limited to a silicon substrate. The body layer 110a may denote only the semiconductor substrate 102. The body layer 110a may include a front side F1, which is an active side, and a back side F2, which is an inactive side.

A process of forming the TSVs 120 in the body layer 110a, for example, the via middle process, is described in more detail with reference to FIG. 1A below.

A wiring layer 130 is formed on the front side F1 of the body layer 110a. The wiring layer 130 may include an intermetallic insulating layer 132, wiring lines 134, and vertical contacts 136. The wiring lines 134 may have a multi-layered structure, and thus, the intermetallic insulating layer 132 may also have a multi-layered structure. The vertical contact 136 may electrically connect the TSVs 120 and the wiring lines 134, and may also electrically connect wiring lines 134 disposed in different layers.

A passivation layer 140 is formed covering the wiring layer 130. The passivation layer 140 may include a plurality of openings that expose an uppermost wire of the wiring layer 130. An external connection terminal 150 may be disposed on each of the plurality of openings. The external connection terminal 150 may be, for example, a bump or a solder ball. A pad may be disposed between an uppermost wiring layer and the external connection terminal 150.

A scribe lane, which is cut to separate a plurality of semiconductor chips from each other as discrete semiconductor chips, may be formed on the device wafer 100a. As illustrated in FIG. 1A, an opening Osl for exposing an area of the wiring layer 130 corresponding to the scribe lane may be formed in the passivation layer 140. The opening Osl of the passivation layer 140 may have a structure that exposes an area corresponding to the whole scribe lane, or may also have a structure that selectively exposes only an area in which a first magnetic material or first magnetic member 160 of FIG. 1B is disposed.

A thickness D1 of the device wafer 100a may be several hundred μm before a back grinding process is performed on the back side F2 of the device wafer 100a. For example, the thickness D1 of the device wafer 100a may be from about 700 μm to 800 μm. As illustrated in FIG. 1A, the thickness D1 of the device wafer 100a may be defined as a thickness from the back side F2 of the body layer 110a to an upper side F3 of the passivation layer 140.

Furthermore, the device wafer 100a may include many different kinds of wafers, such as a wafer for memory devices, a wafer for logic devices, an interposer, and the like, which thinned by back grinding.

Figure 1B:
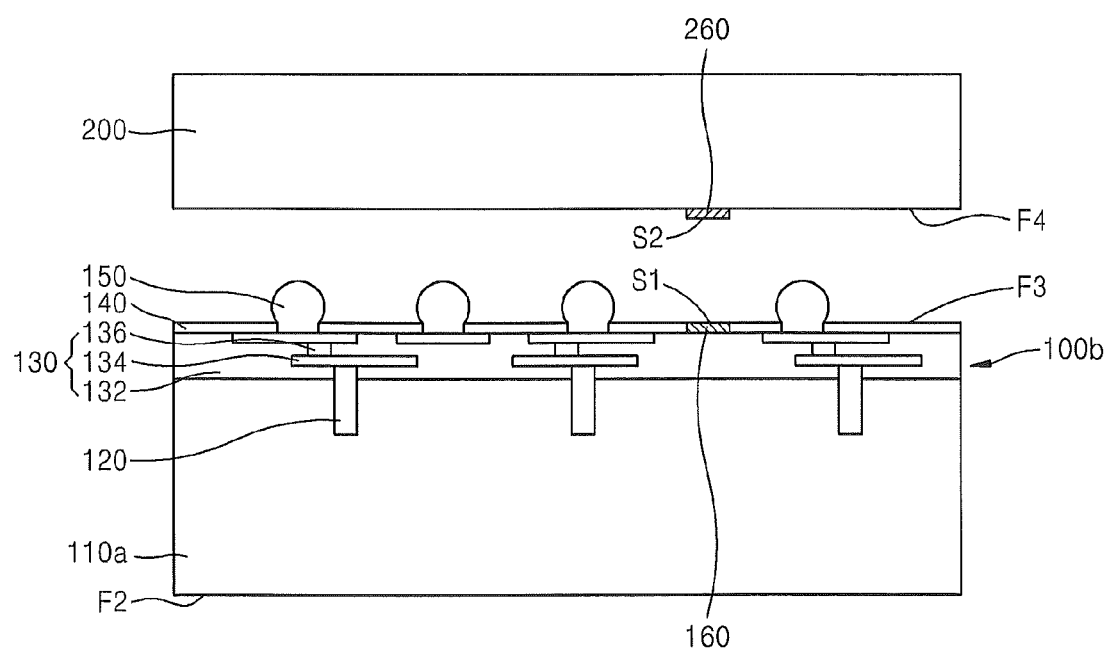

Referring to FIG. 1B, after disposing the external connection terminal 150, the first magnetic material 160 is disposed in the opening Osl of the device wafer 100b. The first magnetic material 160 may be disposed in several predetermined portions of the wiring layer 130 corresponding to the scribe lane. The opening Osl for exposing each of the predetermined portions of the wiring layer 130 may be formed in the passivation layer 140. Although the opening Osl may be formed so as to expose the wiring layer 130 in correspondence to the whole scribe lane, the first magnetic material 160 may be disposed only in several predetermined portions of the openings Osl. However, the first magnetic material 160 may also be disposed in the whole opening Osl.

The first magnetic material 160 is not limited to the scribe lane, and may be disposed at various locations of the device wafer 100b. The disposition of the first magnetic material 160 is described in more detail with reference to FIGS. 10 through 12 below.

The first magnetic material 160 may include at least one of a paramagnetic material, a ferromagnetic material, and a ferrimagnetic material. The paramagnetic material is weakly magnetic in proportion to a magnetic field when the magnetic field is applied externally to the paramagnetic material, and when the magnetic field is removed from the paramagnetic material, the direction of the magnetic field is random due to a thermal molecular motion and thus the magnetism of the paramagnetic material disappears. When the magnetic field is removed from the paramagnetic material, the magnetism of the paramagnetic material does not disappear at once, but may be maintained for a while. Examples of the paramagnetic material include tungsten (W), cesium (Cs), aluminum (Al), lithium (Li), magnesium (Mg), sodium (Na), etc.

When a magnetic field is applied externally to the ferromagnetic material, most magnetic units of the ferromagnetic material are magnetized in the same direction, and thus, the whole ferromagnetic material is strongly magnetic. In addition, although the magnetic field is removed from the ferromagnetic material, the magnetism of the ferromagnetic material is maintained, and thus, the ferromagnetic material may remain as a magnet. Examples of the ferromagnetic material include iron (Fe), cobalt (Co), nickel (Ni), etc.

In the ferrimagnetic material, adjacent magnetic units are aligned in opposite directions, but have different sizes. Thus, the ferrimagnetic material is magnetic in a specific direction. Examples of the ferrimagnetic material include magnetite, ferrite, etc.

Examples of a magnet include a neodymium (NdFeB) magnet, an alnico (AlNiCo) magnet, a samarium cobalt (SmCo) magnet, a ferrite magnet, a bonded magnet, a rubber magnet, etc. The NdFeB magnet is made of Nd and B, which are rare earth metals, by using powder metallurgy molding, and has the strongest magnetic force among commercial magnets. The AlNiCo magnet is made of an alloy of Fe, Ni, Al, and Co, and the SmCo magnet is made of an alloy of Sm, Co, and other rare earth elements.

The ferrite magnet has a chemical formula of $XO+Fe_2O_3$, and barium (Ba) or strontium (Sr) may be used as "X" depending on the purpose. Since the ferrite magnet is made by using a powder metallurgy process, the ferrite magnet may have a complex form and may be arbitrarily magnetized. The bonded magnet may be made of a resin and Nd powder, and the rubber magnet may be made by mixing nitride butadiene rubber (NBR) or chlorinated polyethylene (CPE) with ferrite powder.

After disposing the first magnetic material 160 in the device wafer 100b, a second magnetic material or second magnetic member 260 is disposed on a carrier wafer 200. The second magnetic material 260 may be disposed on a front side or surface F4 of the carrier wafer 200. The carrier wafer 200 supports the device wafer 100b during the back grinding process, and may be a quartz substrate, a glass substrate, a semiconductor substrate, a ceramic substrate, a metal substrate, or the like. The carrier wafer 200 may include a rigid material and may have a sufficient mechanical strength. Accordingly, the carrier wafer 200 is bonded to the device wafer 100b, and the carrier wafer 200 supports the device wafer also after the device wafer 100b becomes thin through the back grinding process. Thus, the device wafer 100b may be easily handled.

A thickness of the carrier wafer 200 may be about from 100 µm to about 1,000 µm. However, the inventive concept is not limited thereto. That is, the thickness of the carrier wafer 200 may be smaller than about 100 µm and may also be larger than 1,000 µm. The size of the carrier wafer 200 may be substantially the same as that of the device wafer 100b. That is, the diameter of the carrier wafer 200 may be substantially the same as that of the device wafer 100b. For example, the diameters of both the carrier wafer 200 and the device wafer 100b may be about 300 mm. However, the inventive concept is not limited thereto.

The second magnetic material 260 may include a magnetic material that is the same as or different from the first magnetic material 160. That is, the second magnetic material 260 may also include at least one of a paramagnetic material, a ferromagnetic material, and a ferrimagnetic material. A lower surface or outwardly facing surface S2 of the second magnetic material 260 is disposed so as to have a polarity that is opposite to that of an upper surface or outwardly facing surface S1 of the first magnetic material 160 facing the second magnetic material 260. For example, when the upper surface S1 of the first magnetic material 160 has an S-polarity, the lower surface S2 of the second magnetic material 260 has an N-polarity. Similarly, when the upper surface S1 of the first magnetic material 160 has an N-polarity, the lower surface S2 of the second magnetic material 260 has an S-polarity.

Since the device wafer 100b is aligned with the carrier wafer 200 by magnetic attraction, the second magnetic material 260 may be disposed in an appropriate position on the carrier wafer 200. For example, when both the device wafer 100b and the carrier wafer 200, which are a notch type wafer or a flat-zone type wafer, have the same structure, a position where the first magnetic material 160 is disposed on the device wafer 100b may be the same as that where the second magnetic material 260 is disposed on the carrier wafer 200. That is, the magnetic materials 160, 260 may be positioned such that they are aligned when the device wafer 100b and the carrier wafer 200 are (properly) aligned.

Figure 1C:
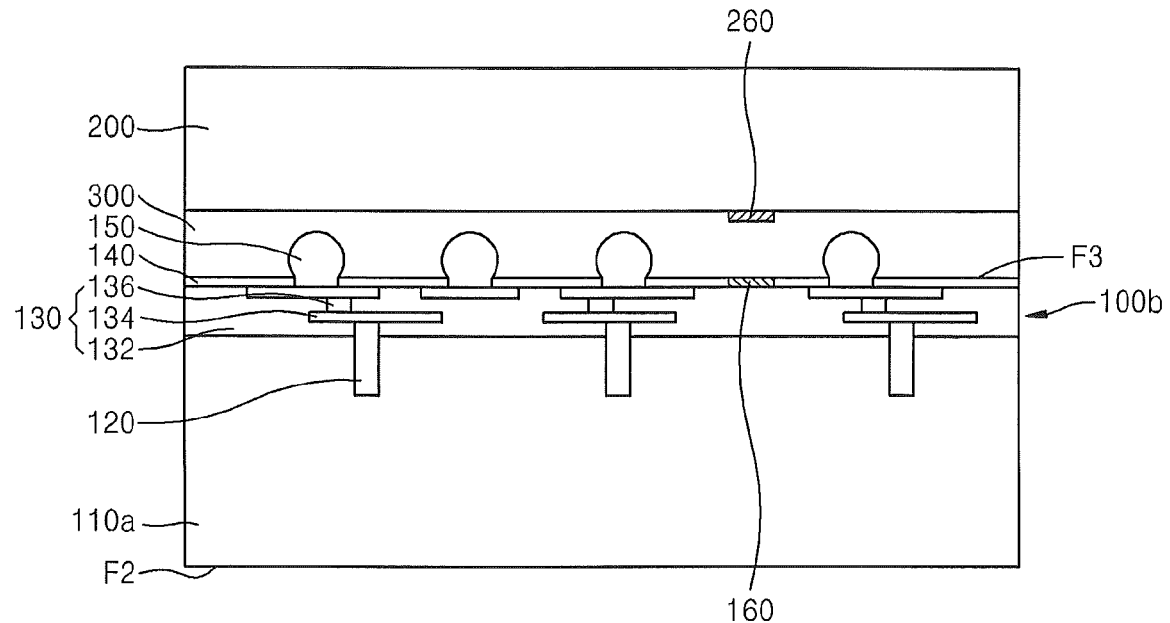

Referring to FIG. 1C, the device wafer 100b is bonded to the carrier wafer 200 by using an adhesive member 300. The adhesive member 300 may be formed of, for example, a non-conductive film (NCF), an anisotropic conductive film (ACF), an ultraviolet (UV) film, an instant adhesive, a thermosetting adhesive, a laser hardening-type adhesive, an ultrasonic hardening-type adhesive, or the like.

The bonding between the device wafer 100b and the carrier wafer 200 may be made by two types of forces. A first force is an adhesive force by the adhesive member 300, and a second force is a magnetic attraction between the first magnetic material 160 of the device wafer 100b and the second magnetic material 260 of the carrier wafer 200.

A bonding by the adhesive member 300 may cause a misalignment between the device wafer 100b and the carrier wafer 200 during a bonding process because an adhesive material has fluidity and does not have directivity. However, the magnetic attraction between the first magnetic material 160 and the second magnetic material 260 has directivity by which the first and second magnetic materials 160 and 260 are directed (e.g., attracted) to each other, and thus may minimize a misalignment between the device wafer 100b and the carrier wafer 200 during a bonding process.

When a paramagnetic material is used as the first and second magnetic materials 160 and 260, a bonding process may be directly performed via the adhesive member 300 after momentarily applying a magnetic field to the device wafer 100b and the carrier wafer 200. As described above, since the magnetism of the paramagnetic material disappears after a magnetic field is removed therefrom, the bonding process may be performed while the magnetism is maintained.

Figure 1D:
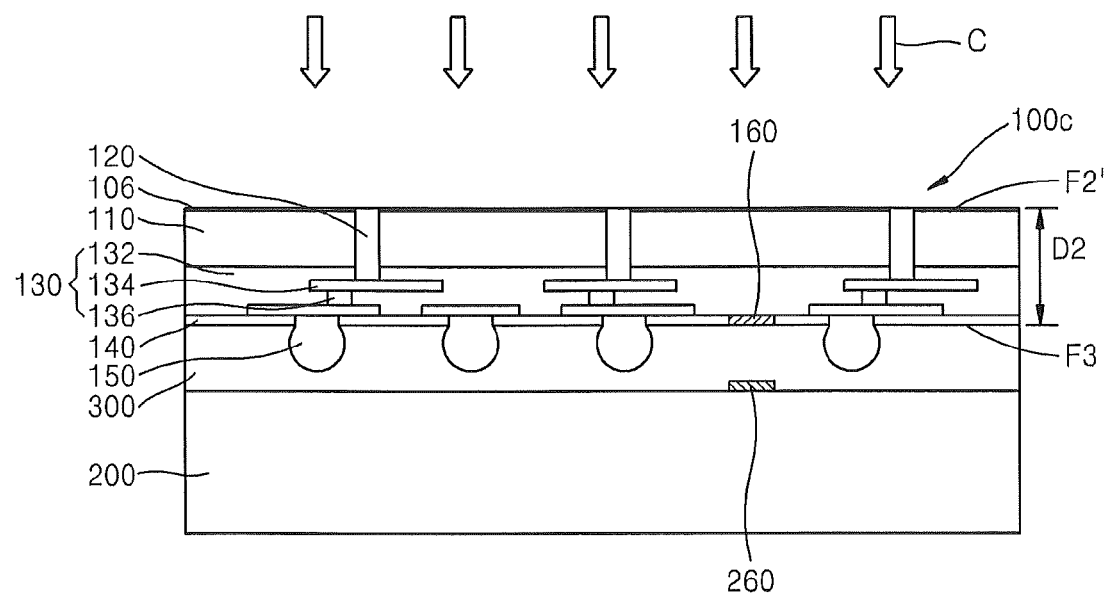

Referring to FIG. 1D, after bonding the device wafer 100b and the carrier wafer 200, the back side F2 of the device wafer 100b of FIG. 1C is ground to be thin and expose the TSVs 120 formed in the body layer 110 at a back side F2' of a ground device wafer 100c. Once the device wafer 100c is thin through the back grinding, the thickness D2 of the device wafer 100c may be equal to or less than about 100 µm. In some embodiments, the thickness D2 of the device wafer 100c may be equal to or less than about 50 µm after the back grinding. For example, the thickness D2 of the device wafer 100c may be from about 10 µm to about 30 µm.

After the back grinding, a first protective layer 106 may exist on the back side F2' of the device wafer 100c. Accordingly, after the back grinding, the thickness D2 of the device wafer 100c may be defined as a thickness from the lower surface F3 of the passivation layer 140 to an upper surface F2' of the first protective layer 106.

A process of back grinding the device wafer 100b so as to be thin and of exposing the TSVs 120 is described in detail with reference to FIGS. 8A through 8D below.

Figure 1E:
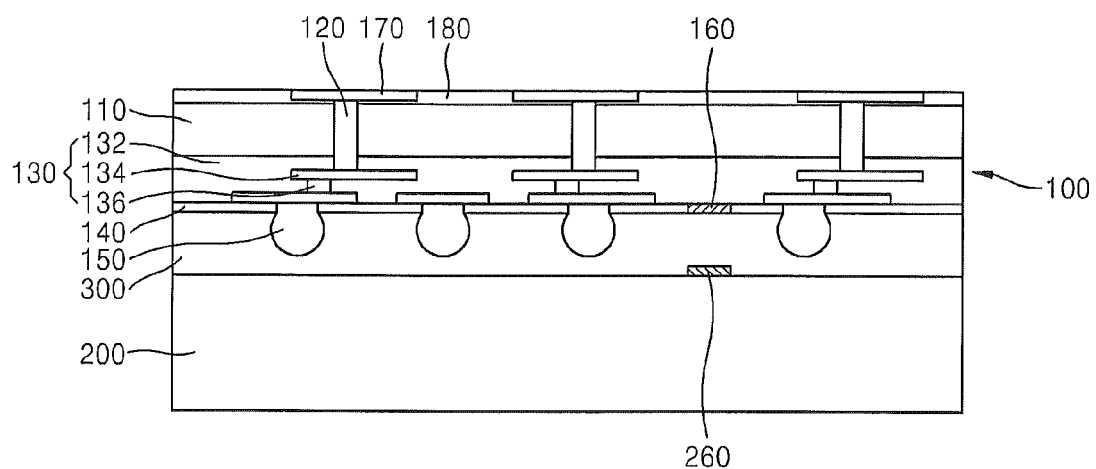

Referring to FIG. 1E, after the back grinding of the device wafer 100b, a redistribution line 170 that is connected to the exposed TSVs 120 is formed. In addition, a protective layer 180 that covers the back side of the device wafer 100c and surrounds the redistribution line 170 may be formed. The protective layer 180 may include the first protective layer 106 described above. The protective layer 180 may be formed of an oxide film, a nitride film, or a double layer including the oxide film and the nitride film. The protective layer 180 may be formed of an oxide film, e.g., a silicon oxide ($SiO_2$) film, by using high density plasma chemical vapor deposition (HDP-CVD).

Figure 1F:
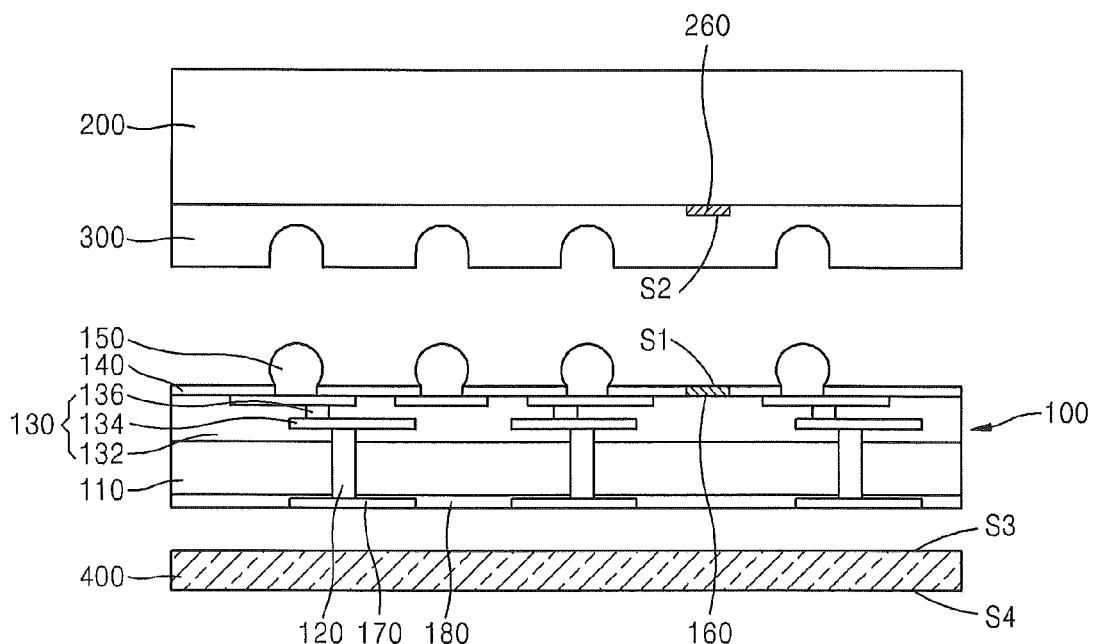

Referring to FIG. 1F, a magnetic plate 400 is disposed adjacent to any one of the device wafer 100 and the carrier wafer 200. By applying a magnetic force through the magnetic plate 400, the device wafer 100 is separated from the carrier wafer 200. The magnetic force that is applied through the magnetic plate 400 may vary according to a magnetic material which the magnetic plate faces.

For example, the magnetic plate 400 may be disposed adjacent to the device wafer 100, and a first surface S3 of the magnetic plate 400 may face the device wafer 100. The lower surface S2 of the second magnetic material 260 disposed on the carrier wafer 200 may have an N-polarity. In this case, the first surface S3 of the magnetic plate 400 may have an N-polarity, and thus, an N-polarity magnetic field may be applied to the device wafer 100 and the carrier wafer 200. The applied N-polarity magnetic field may generate a magnetic repulsive force with respect to the second magnetic material 260 of the carrier wafer 200, and may contribute to the separation of the device wafer 100 from the carrier wafer 200.

The upper surface S1 of the first magnetic material 160 of the device wafer 100 has an S-polarity, but an N-polarity magnetic force of the first surface S3 of the magnetic plate 400 may be larger than an S-polarity magnetic force of the first magnetic material 160. Thus, a magnetic repulsive force is dominant between the magnetic plate 400 and the second magnetic material 260. Furthermore, an S-polarity magnetic force may be generated at a second surface S4 of the magnetic plate 400 according to the magnetic field principle.

The separation though a repulsive force generated by magnetism of the magnetic plate 400 may be simultaneously performed together with weakening the adhesive force of the adhesive member 300. Various methods may be used to weaken the adhesive force of the adhesive member 300, according to a type of the adhesive member 300. For example, the weakening of the adhesive force may be performed through UV laser irradiation. That is, when heat is applied to the adhesive member 300 through the UV laser irradiation, the adhesive force is weakened, and thus, the carrier wafer 200 may be more easily separated from the device wafer 100. In some cases, by completely or partially removing the adhesive member 300 through laser ablation, the adhesive force of the adhesive member 300 may be weakened. In addition, various methods, such as a thermal method, a laser method, a chemical method, a mechanical method, and the like, may be used as the method of weakening the adhesive force of the adhesive member 300.

Since the device wafer 100 is very thin through the back grinding, it is difficult to handle the device wafer 100 when the device wafer 100 is separated from the carrier wafer 200. Thus, a tape mounting process for the device wafer 100 or a process of transferring the device wafer 100 to a supporting wafer may be performed before the process of separating the device wafer 100 from the carrier wafer 200. For example, although not illustrated, the device wafer 100 may be previously bonded to a ring mount through the tape mounting process.

Figure 1G:
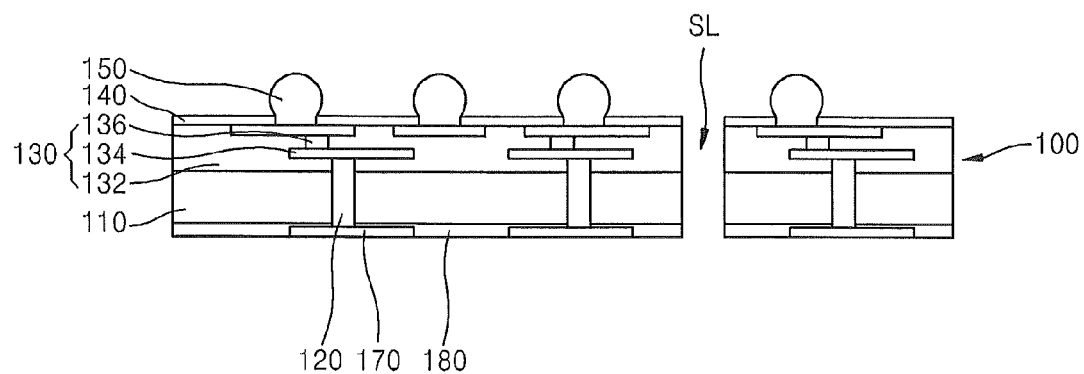

Referring to FIG. 1G, the device wafer 100 is divided into discrete semiconductor chips by sawing a scribe lane SL, and semiconductor devices are completed by performing a series of subsequent processes on the discrete semiconductor chips. In the process of sawing the scribe lane SL, the first magnetic material 160 disposed in the scribe lane SL of the device wafer 100 may be automatically removed.

In the series of subsequent processes, each of the discrete semiconductor chips may be attached to a circuit substrate, and an electrical connection process, an encapsulation process, an input and output terminal forming process, and a sawing process may be performed on each discrete semiconductor chip attached to the circuit substrate to make a semiconductor device having a package form. As another example, a plurality of the discrete semiconductor chips may be stacked on a circuit substrate, and an electrical connection process, an encapsulation process, an input and output terminal forming process, and a sawing process may be performed on the plurality of discrete semiconductor chips stacked on the circuit substrate to make a semiconductor device having a stack package form.

By using a wafer processing method or a method of manufacturing a semiconductor device, according to some embodiments, a device wafer may be accurately aligned and bonded to a carrier wafer by bonding the device wafer to the carrier wafer via a magnetic material. Thus, a misalignment between the device wafer and the carrier wafer may be minimized. The accurate bonding between the device wafer and the carrier wafer may minimize a possibility of a physical touch with a front opening unified pod (FOUP) or an external apparatus such as a holder in a facility, which may occur due to an inaccurate bonding between the device wafer and the carrier wafer during a back grinding process and a subsequent process, and thus, damage, such as chipping, cracks, and breaks of the device wafer, may be prevented beforehand.

Figure 2:
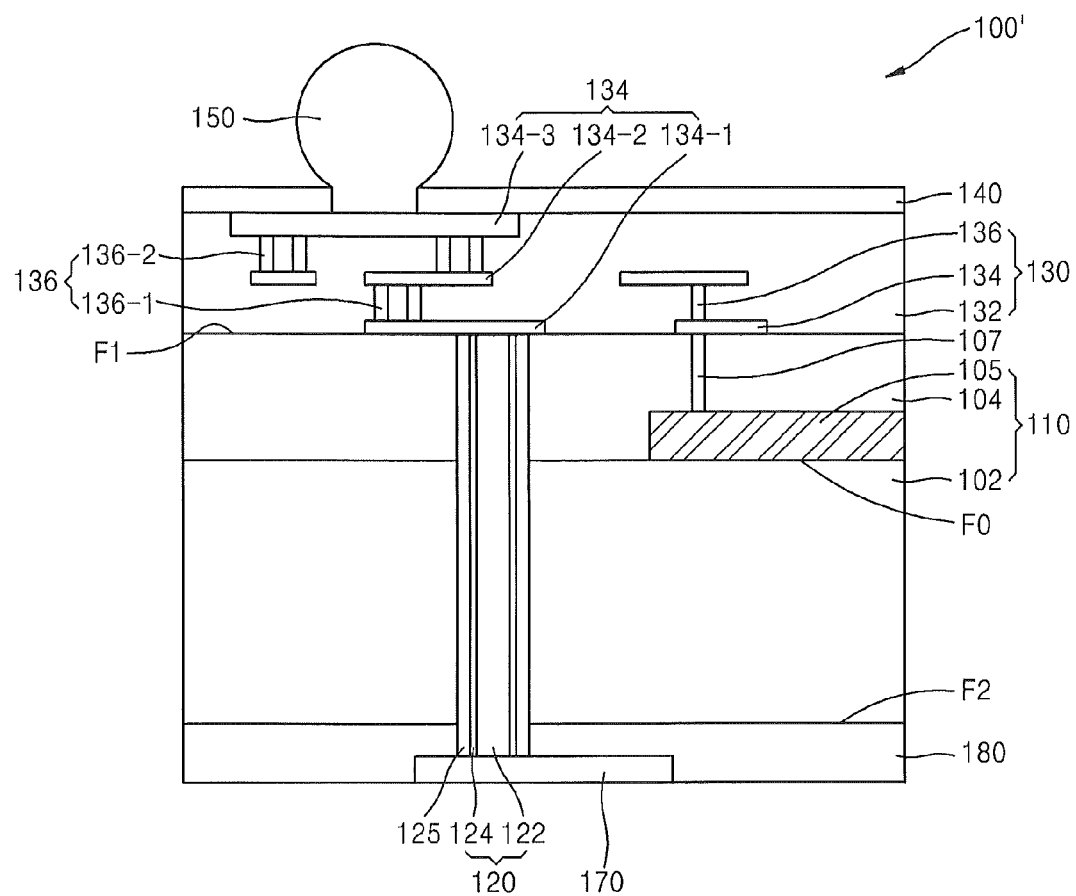
FIG. 2 is a cross-sectional view of a semiconductor device according to an embodiment of the inventive concept.

FIG. 2 is a cross-sectional view of a semiconductor device 100' according to an embodiment of the inventive concept, showing a main part of a semiconductor device obtained before performing a package process after the sawing process described with reference to FIG. 1G.

Referring to FIG. 2, the semiconductor device 100' may include a body layer 110, a TSV 120, a wiring layer 130, a passivation layer 140, an external connection terminal 150, a redistribution line 170, and a protective layer 180.

The body layer 110 may include a semiconductor substrate 102, an interlayer insulating layer 104, and an integrated circuit layer 105. The semiconductor substrate 102 may be formed of a semiconductor wafer. For example, the semiconductor substrate 102 may include a group IV material or a group III-V compound. The semiconductor substrate 102 may be formed of a single crystal wafer such as a single crystal silicon wafer. However, the inventive concept is not limited thereto. For example, various wafers, such as an epitaxial wafer, a polished wafer, an annealed wafer, a silicon on insulator (SOI), and the like, may be used as the semiconductor substrate 102. The epitaxial wafer is a wafer obtained by growing a crystalline material on a single crystal silicon substrate.

The semiconductor substrate 102 may include a first surface F0 and a second surface F2, and the integrated circuit layer 105 may be formed on the first layer F0 of the semiconductor substrate 102. Although the integrated circuit layer 105 is formed on the first surface F0 for convenience of understanding, the integrated circuit layer 105 may include an impurity doping region formed in an upper region of the semiconductor substrate 102, which is adjacent to the first surface F0. A lower region of the semiconductor substrate 102, which is adjacent to the second surface F2, may be an undoped region.

The interlayer insulating layer 104 may be formed on the first surface F0 of the semiconductor substrate 102 while covering the integrated circuit layer 105. The interlayer insulating layer 104 may separate circuit devices in the integrated circuit layer 105 from each other. Also, the interlayer insulating layer 104 may separate the circuit devices in the integrated circuit layer 105 from the wiring layer 130. The interlayer insulating layer 104 may include one of an oxide layer, a nitride layer, a low dielectric constant layer, and a high dielectric constant layer or a stack structure including two or more of them.

The integrated circuit layer 105 may be formed adjacent to the first surface F0 of the semiconductor substrate 102 in the semiconductor substrate 102 and the interlayer insulating layer 104, and may include a plurality of circuit devices. The integrated circuit layer 105 may include, for example, a plurality of transistors, a plurality of diodes, and/or a plurality of capacitors, depending on a type of the semiconductor device 100'. The semiconductor device 100' may be a memory device or a non-memory device, depending on a structure of the integrated circuit layer 105. In the case where the semiconductor device 100' is a non-memory device, the semiconductor device 100' may be a logic device, such as a central processing unit (CPU) or a microprocessor. In the case where the semiconductor device 100' is a memory device, the semiconductor device 100' may include any one of various memory devices, such as DRAM, SRAM, flash memory, EEPROM, PRAM, RRAM, FeRAM, MRAM, and the like. A conductive contact 107 may electrically connect the circuit devices of the integrated circuit layer 105 to a wiring pattern of the wiring layer 130.

As the interlayer insulating layer 104 is included in the body layer 110, an upper surface of the interlayer insulating layer 104 may correspond to the front side F1 of the body layer 110a of FIG. 1A. In addition, the second surface F2 of the semiconductor substrate 102 may correspond to the back side F2 of the body layer 110a.

The TSV 120 may penetrate the interlayer insulating layer 104 and the semiconductor substrate 102, and one end of the TSV 120 may be exposed on the second surface F2 of the semiconductor substrate 102. The TSV 120 may have a structure protruding from the second surface F2 of the semiconductor substrate 102, and a side of a protruding portion may be surrounded by the protective layer 180. As illustrated in FIG. 2, the redistribution line 170 may be disposed on the undersurface of the protruding portion of the TSV 120. A pad may be disposed on the redistribution line 170. In some cases, the redistribution 170 itself may be the pad.

The TSV 120 may include at least one metal layer. For example, the TSV 120 may include a wiring metal layer 122 and a barrier metal layer 124. The wiring metal layer 122 may include one or more of aluminum (Al), gold (Au), beryllium (Be), bismuth (Bi), cobalt (Co), copper (Cu), hafnium (Hf), indium (In), manganese (Mn), molybdenum (Mo), nickel (Ni), lead (Pb), palladium (Pd), platinum (Pt), rhodium (Rh), rhenium (Re), ruthenium (Ru), tantalum (Ta), telryum (Te), titanium (Ti), tungsten (W), zinc (Zn), and zirconium (Zr). For example, the wiring metal layer 122 may include one selected from W, Al, and Cu or a stack structure including two or more of them. The barrier metal layer 124 may include one selected from Ti, Ta, titanium nitride (TiN), and tantalum nitride (TaN) or a stack structure including two or more of them. However, the material of the TSV 120 is not limited to the materials specified above.

A spacer insulating layer 125 may be interposed between the TSV 120 and the semiconductor substrate 102. The spacer insulating layer 125 may block a direct contact between circuit devices and the TSV 120 in the semiconductor substrate 102 or the interlayer insulating layer 104. The spacer insulating layer 125 may not be formed on the undersurface of the TSV 120. In some embodiments, the spacer insulating layer 125 may not be formed also at sides of the TSV 120 where it protrudes on the second surface F2 of the semiconductor substrate 102.

The wiring layer 130 may include an intermetallic insulating layer 132, wiring lines 134, and vertical contacts 136. The intermetallic insulating layer 132 may be provided on the interlayer insulating layer 104 so as to cover the wiring lines 134 that are multi-layer wiring lines. The intermetallic insulating layer 132 may separate the wiring lines 134 from each other. Although the intermetallic insulating layer 132 illustrated in FIG. 2 is a single layer, the intermetallic insulating layer 132 may include a plurality of insulating layers. For example, the intermetallic insulating layer 132 may include a plurality of insulating layers depending on the number of layers of the wiring lines 134.

The wiring lines 134 may be formed in the intermetallic insulating layer 132 on the interlayer insulating layer 104, and may be electrically connected to the TSV 120. The wiring lines 134 may be formed to have at least one layer, and different wiring lines 134 corresponding to different layers may be electrically connected to each other via the vertical contacts 136. The wiring lines 134 may be used to connect the circuit devices of the integrated circuit layer 105 to each other or may be used to electrically connect the circuit devices to an external device.

In the illustrated embodiment, the wiring lines 134 may include three wiring lines, e.g., a first wiring line 134-1 as a lowest layer, a second wiring line 134-2 as an intermediate layer, and a third wiring line 134-3 as a highest layer. A first vertical contact 136-1 may be disposed between the first wiring line 134-1 and the second wiring line 134-2, a second vertical contact 136-2 may be disposed between the second wiring line 134-2 and the third wiring line 134-3, and different wiring lines corresponding to different layers may be connected to each other by the first and second vertical contacts 136-1 and 136-2. Pads, which may be connected to an external connection terminal 150, may be disposed on the third wiring line 134-3. The wiring lines 134 may be formed of Cu and/or Al. For example, the first and second wiring lines 134-1 and 134-2 may be formed of Cu, and the third wiring line 134-3 may be formed of Al.

Although the structure and material of the wiring lines 134 formed of three layers are described above, the inventive concept is not limited thereto. For example, the wiring lines 134 may be formed of four or more layers or two or less layers. The wiring lines 134 are not limited to Cu or Al, and may be formed of another material, such as W, Ni, Au, or Ag. In addition, the connection structure of the wiring lines 134 illustrated in FIG. 2 is only exemplary. That is, the connection structure of the wiring lines 134 is not limited to the structure illustrated in FIG. 2, and may be variously changed depending on a type of the semiconductor device 100'.

The first through third wiring lines 134-1, 134-2, and 134-3 of the wiring lines 134 and the first and second vertical contacts 136-1 and 136-2 may be formed of the same material or may also be formed of different materials. For example, in a damascene structure, the wiring lines 134 and the vertical contacts 136 corresponding thereto may be formed of the same material. Furthermore, the wiring lines 134 and the vertical contacts 136 may include at least one barrier metal as well as a wiring metal.

The passivation layer 140 may be formed on the wiring layer 130 to protect an upper surface of the semiconductor device 100'. The passivation layer 140 may be formed of an oxide film, a nitride film, or a double layer including the oxide film and the nitride film. The passivation layer 140 may be formed of an oxide film, e.g., a $SiO_2$ film, by using high density plasma chemical vapor deposition (HDP-CVD).

The external connection terminal 150 may be a bump or a solder ball. The external connection terminal 150 may be connected to the wiring layer 130, e.g., the third wiring line 134-3, and thus may be electrically to the TSV 120.

The external connection terminal 150 may be formed on the third wiring line 134-3, and may be formed of a solder including tin (Sn). In some cases, the external connection terminal 150 may be formed of Pd, Ni, Ag, Pb, or an alloy thereof. An upper portion of the external connection terminal 150 may have a hemispherical shape. The external connection terminal 150 may have the hemispherical shape through a reflow process, but a shape that is slightly different from the hemispherical shape may be formed according to the reflow process. A pad may be disposed between the external connection terminal 150 and the third wiring line 134-3. In some cases, the third wiring line 134-3 itself may function as the pad. An under bump metal (UBM) may be disposed in a lower portion of the external connection terminal 150.

FIGS. 3A through 3D are cross-sectional views illustrating, in more detail, processes that are performed until the external connection terminal 150 of FIG. 1A is formed.

Referring to FIG. 3A, the integrated circuit layer 105 is formed on the first surface F0 of the semiconductor substrate 102, and the interlayer insulating layer 104 covering the integrated circuit layer 105 is formed on the first surface F0 of the semiconductor substrate 102. As described above, the integrated circuit layer 105 may be formed in both the semiconductor substrate 102 and the interlayer insulating layer 104. The semiconductor substrate 102, the interlayer insulating layer 104, and the integrated circuit layer 105 may constitute the body layer 110a of the device wafer 100a of FIG. 1A.

Since the semiconductor substrate 102 and the integrated circuit layer 105 have already been described with reference to FIG. 2 above, a detailed description with respect to FIGS. 3A through 3D is omitted.

The interlayer insulating layer 104 may be formed of an oxide layer, a nitride layer, a low dielectric constant layer, a high dielectric constant layer, or the like, and may be formed by using an insulating layer deposition method, e.g., a chemical vapor deposition (CVD) method. However, the inventive concept is not limited thereto. The interlayer insulating layer 104, formed by using the insulating layer deposition method, may not be flat depending on a profile of the integrated circuit layer 105. Thus, a planarization process may be performed on the interlayer insulating layer 104 to make the interlayer insulating layer 104 flat. The planarization process may be performed by using chemical mechanical polishing (CMP) and/or etch-back.

After the interlayer insulating layer 104 is formed, the upper surface of the interlayer insulating layer 104 may correspond to the front side F1 of the body layer 110a. The second surface F2 of the semiconductor substrate 102 may correspond to the back side F2 of the body layer 110a.

Figure 3B:
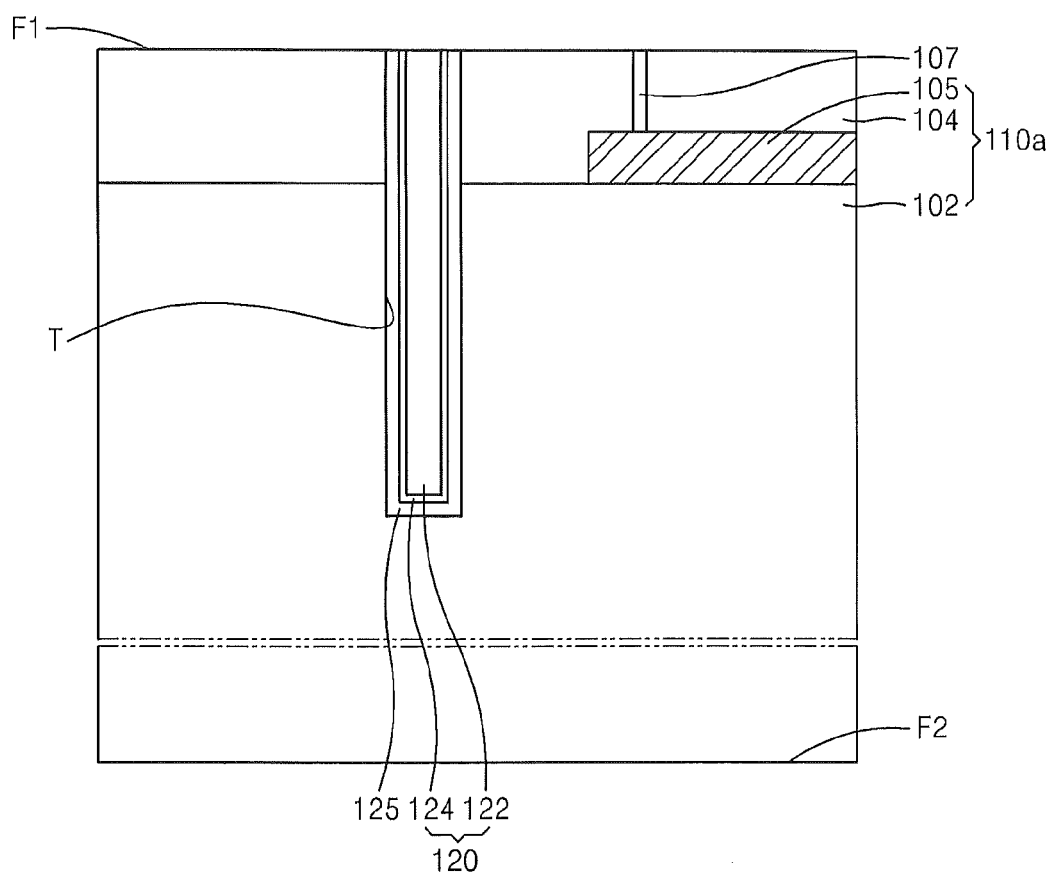

Referring to FIG. 3B, a trench T is formed in the interlayer insulating layer 104 and the semiconductor substrate 102, and the spacer insulating layer 125 and the TSV 120 are formed in the trench T.

In more detail, a resist pattern may be formed on the interlayer insulating layer 104, and the trench T may be formed by continuously removing a portion of the interlayer insulating layer 104 and a portion of the semiconductor substrate 102 through an etching process using the resist pattern. The trench T may also be formed by using a laser drilling process.

Since the semiconductor substrate 102 is relatively thick before performing a back grinding process thereon, the trench T may be formed so as not to penetrate the semiconductor substrate 102, as illustrated in FIG. 3B. The trench T may have various shapes according to etching conditions or drilling conditions. For example, the trench T may have a relatively uniform cylindrical shape, and may have a shape in which the width thereof gradually narrows downwardly.

Next, the spacer insulating layer 125 is formed in the trench T. For example, the spacer insulating layer 125 may include an insulating layer, such as an oxide layer, a nitride layer, or a polymer or parylene layer, and may be formed by using low temperature deposition, such as low temperature chemical vapor deposition (LTCVD), polymer spraying, and low temperature physical vapor deposition (PVD).

Subsequently, the TSV 120 is formed on the spacer insulating layer 125. For example, the TSV 120 may be formed by forming the barrier metal layer 124 on the spacer insulating layer 125 in the trench T and forming the wiring metal layer 122 on the barrier metal layer 124. The barrier metal layer 124 may be formed of one of Ti, Ta, TiN, and TaN or may have a stack structure including two or more thereof. The wiring metal layer 122 may be formed of one of W, Al, and Cu or may have a stack structure including two or more thereof. The barrier metal layer 124 and the wiring metal layer 122 may be formed by using CVD, plasma-enhanced CVD (PECVD), HDP-CVD, sputtering, metal organic CVD (MOCVD), or atomic layer deposition (ALD). The wiring metal layer 122 may be formed by using a plating method, and in such embodiments, a plating layer may be formed after forming a seed layer. When forming the wiring metal layer 122 by using the plating method, Cu may be used.

After filling the trench T, a planarization process may be performed. For example, a planarization process may be performed by using CMP and/or etch-back so that the spacer insulating layer 125 and the TSV 120 remains only inside the trench T. Preheating and buffering CMP may be formed after performing the planarization process by using CMP.

A conductive contact 107 that is connected to the integrated circuit layer 105 may be formed before or after the formation of the TSV 120.

Figure 3C:
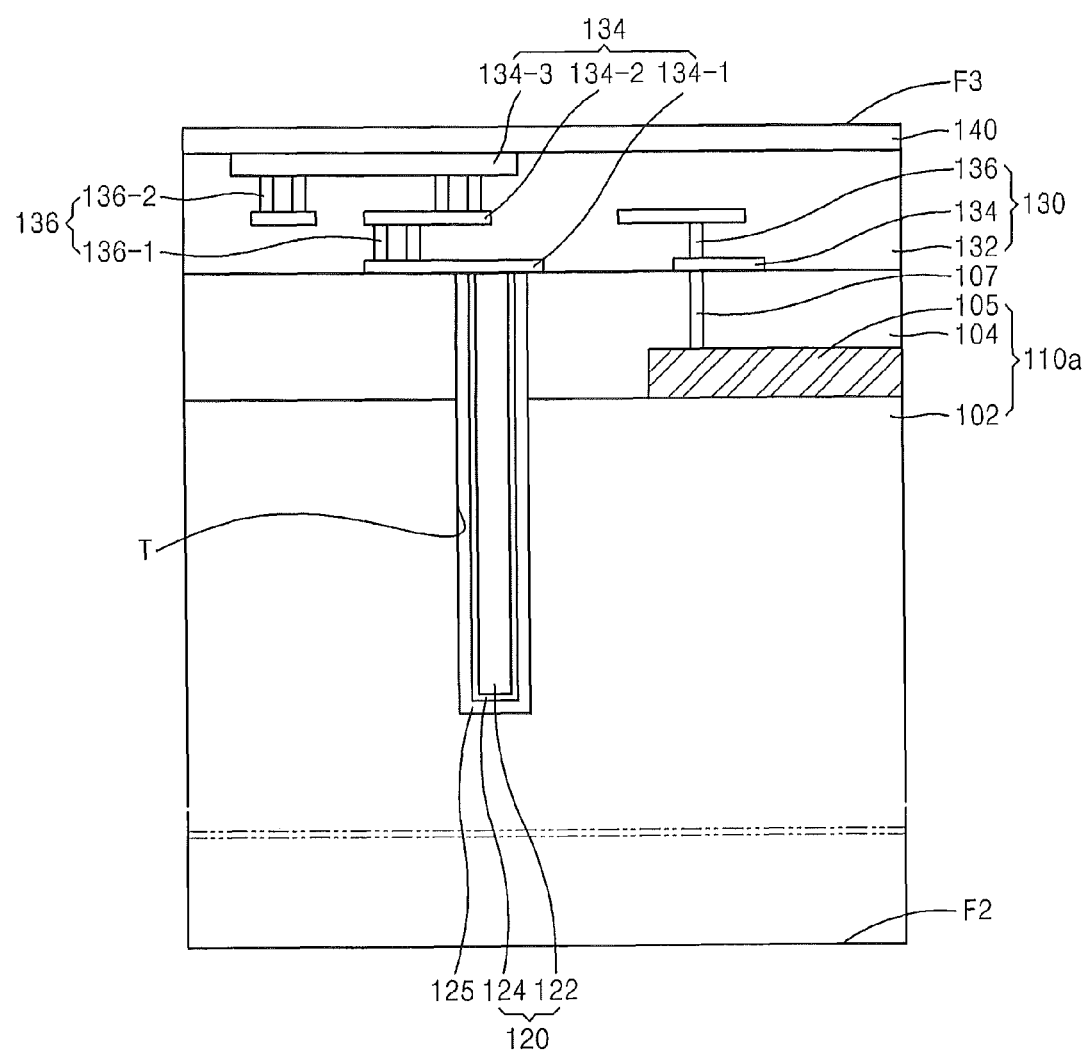

Referring to FIG. 3C, the wiring layer 130 is formed on the interlayer insulating layer 104, and the passivation layer 140 is formed on the wiring layer 130. As described above, the wiring layer 130 may include the intermetallic insulating layer 132, the wiring lines 134, and the vertical contacts 136. The wiring lines 134 may be electrically connected to the TSV 120. The wiring layer 130 may be formed by using a material film deposition and patterning process or a damascene process. For example, when the wiring lines 134 include Al and/or W, the wiring lines 134 may be formed by the using a material film deposition and patterning process. When the wiring lines 134 include Cu, the wiring lines 134 may be formed by using a damascene process.

Figure 3D:
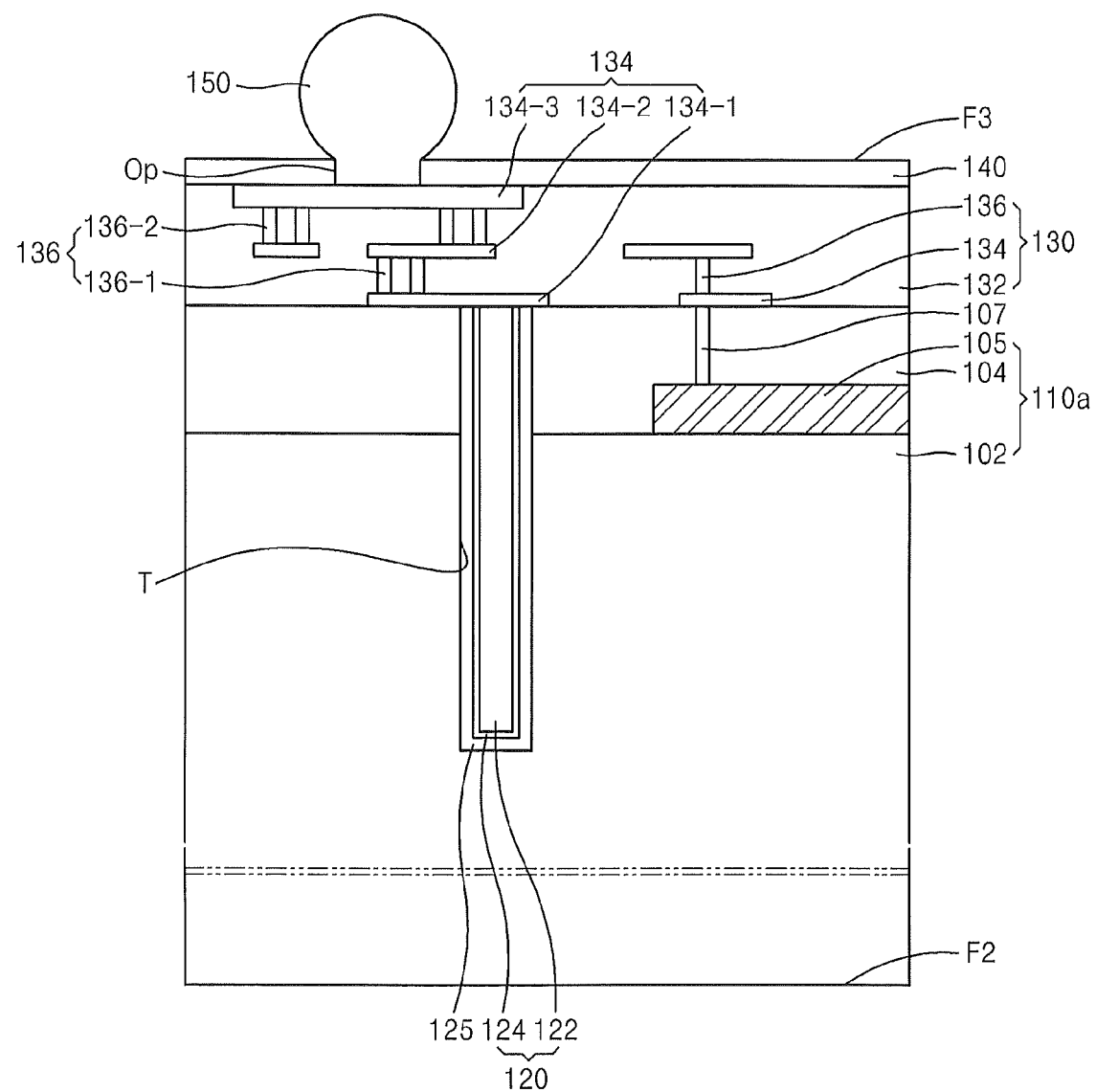

Since the wiring layer 130 and the passivation layer 140 have already been described with reference to FIG. 2 above, a detailed description with respect to FIGS. 3C and 3D is omitted.

Referring to FIG. 3D, the external connection terminal 150 that is connected to the wiring lines 134, e.g., the third wiring line 134-3, is formed on the passivation layer 140. The external connection terminal 15Q may be formed by forming an opening Op, which exposes a portion of the third wiring line 134-3, in the passivation layer 140 and then forming a solder that fills the opening Op and protrudes in a hemispherical shape. In some embodiments, after a pad is formed on the third wiring line 134-3 in the opening Op, the external connection terminal 150 may be disposed on the pad.

As the external connection terminal 150 is disposed on the passivation layer 140, the device wafer 100a of FIG. 1A is completed. Although not illustrated, an opening (e.g., the opening Osl of FIG. 1A) that exposes the wiring layer 130 to correspond to a portion of a scribe lane or the whole scribe lane may be formed in the passivation layer 140.

Figure 4A:
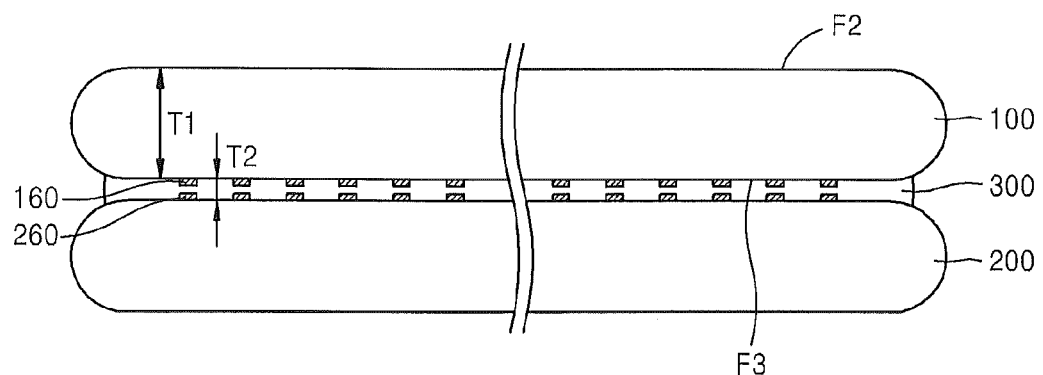
FIGS. 4A and 4B are cross-sectional views illustrating a process of bonding a device wafer to a carrier wafer, according to an embodiment of the inventive concept.
Figure 4B:
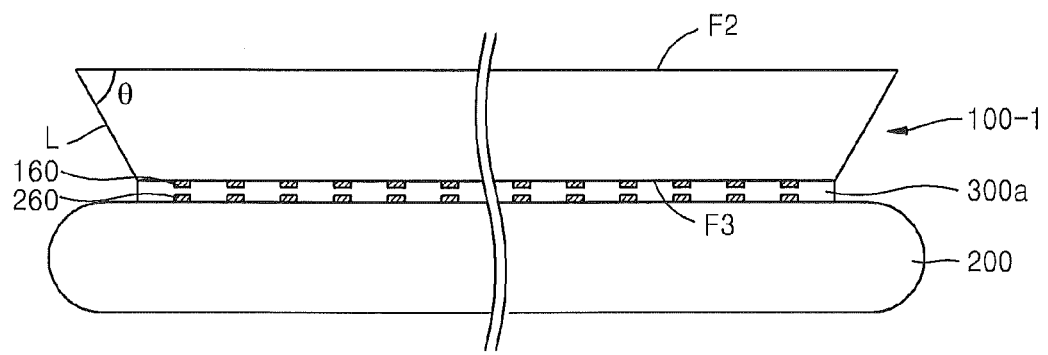

FIGS. 4A and 4B are cross-sectional views illustrating a process of bonding a device wafer 100 to a carrier wafer 200, according to an embodiment of the inventive concept. In order to simplify the drawings, the first and second magnetic materials 160 and 260 are illustrated, and other elements, e.g., an external connection terminal and a TSV are not illustrated in FIGS. 4A and 4B.

Referring to FIG. 4A, like in FIG. 1C, the device wafer 100 is attached onto the carrier wafer 200 by using an adhesive member 300 and the first and second magnetic materials 160 and 260. Both the side of the device wafer 100 and the side of the carrier wafer 200 may have a curved form. The front side F3 of the device wafer 100, in which an integrated device layer was formed, may be attached to the carrier wafer 200 via the adhesive member 300. Thus, the back side F2 of the device wafer 100 may be exposed upward or face upwardly. The front side F3 of the device wafer 100 may correspond to the upper surface F3 of the passivation layer 140 of the device wafer 100b shown in FIG. 1B, and the back side F2 of the device wafer 100 may correspond to the back side F2 of the body layer 110 of the device wafer 100b.

The thickness T1 of the device wafer 100 before a back grinding process may be, for example, from about 700 μm to about 800 μm. However, the inventive concept is not limited thereto. The adhesive member 300 may include a polymer material having an adhesive property. For example, the adhesive member 300 may be formed of a liquid-type material, and may include a resin for UV curing or a resist. The adhesive member 300 may be separated from the device wafer 100 through UV laser irradiation. The adhesive member 300 may be disposed between the device wafer 100 and the carrier wafer 200, and may surround a portion of the side of the device wafer 100 and a portion of the side of the carrier wafer 200, as illustrated in FIG. 4A. The thickness of the adhesive member 300 may be from about 5 μm to about 200 μm. Also, the thickness of the adhesive member 300 may be, for example, from about 50 μm to about 120 μm. However, the inventive concept is not limited thereto.

Referring to FIG. 4B, an edge portion of a device wafer 100-1 is slantingly cut. That is, the edge portion is slantingly cut so that an angle (i.e., an interior angle θ) between the back side F2 of the device wafer 100-1 and an inclined plane or surface L is an acute angle. The interior angle θ may be, for example, from about 35° to about 45°.

The slant cutting may be performed on both the device wafer 100 and the adhesive member 300 at the same time. Through the slant cutting of the edge portion, the size of the device wafer 100-1 may be smaller than that of the carrier wafer 200. For example, the size of the front side F3 of the device wafer 100-1 may be reduced due to the slant cutting, and thus, the size of the front side F3 of the device wafer 100-1 after the slant cutting may be smaller than that of the front side F3 of the device wafer 100 of FIG. 4A before the slant cutting. For example, after the slant cutting, the diameter of the front side F3 of the device wafer 100-1 may be reduced by about 1,000 μm or more compared to before the slant cutting. In some embodiments, after the slant cutting, the diameter of the front side F3 of the device wafer 100-1 may be reduced by about 1,000 μM or less compared to before the slant cutting.

Since the carrier wafer 200 is generally reused, an edge portion thereof may not be cut or trimmed. In some embodiments, an edge portion of the carrier wafer 200 may be cut. After the slant cutting, a back grinding process may be performed on the device wafer 100-1, as shown in FIG. 1D.

By using the process of FIGS. 4A and 4B, the device wafer 100-1 and the carrier wafer 200 may be accurately aligned and bonded to each other through the first and second magnetic materials 160 and 260, and thus, damage to the device wafer 100, e.g., chipping, cracks, and breaks due to a touch with an FOUP or an external apparatus such as a holder, may be minimized. In addition, as the size of the device wafer 100-1 is smaller than that of the carrier wafer 200 through the slant cutting, external shock that is applied to an edge portion of the device wafer 100-1 in a back grinding process or a subsequent process may be reduced, and thus, damage to the device wafer 100-1 may be further reduced. Furthermore, the adhesive member 300a is minimally exposed through the slant cutting, and thus, contamination due to the adhesive member 300a may be prevented in subsequent processes.

Figure 5A:
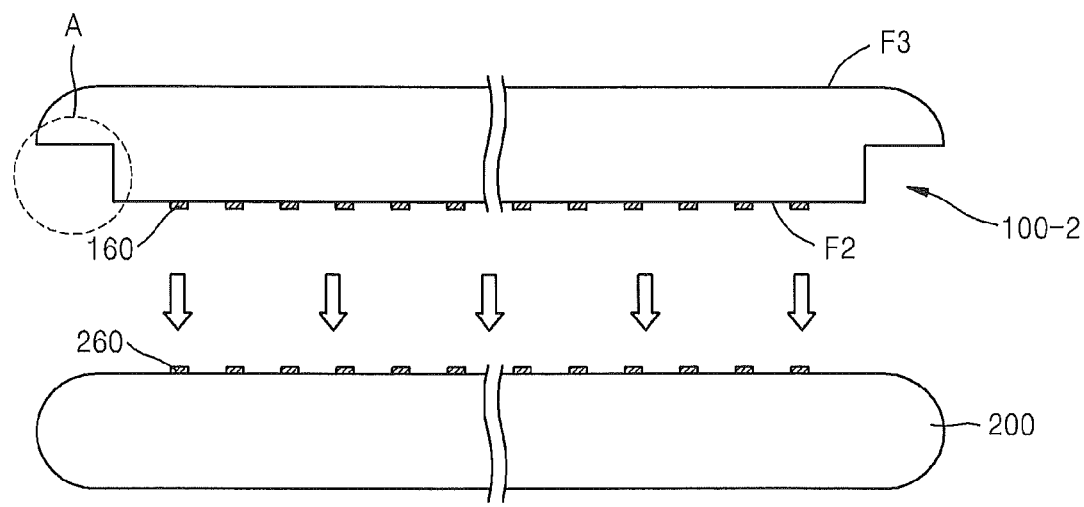
FIGS. 5A and 5B are cross-sectional views illustrating processes of bonding a device wafer to a carrier wafer, according to embodiments of the inventive concept.
Figure 5B:
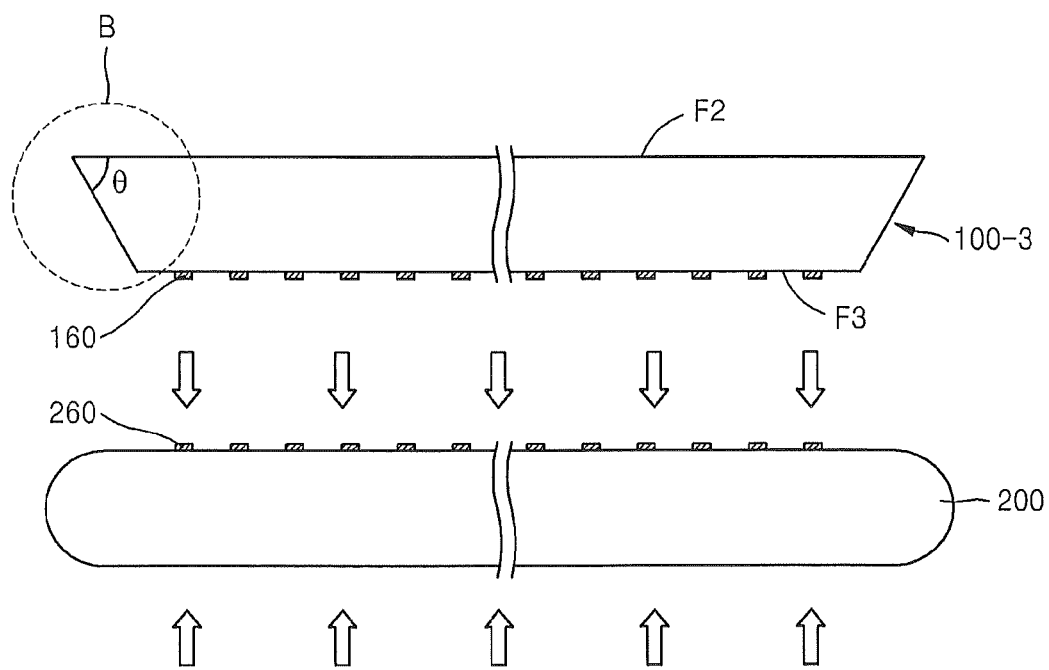

FIGS. 5A and 5B are cross-sectional views illustrating a process of bonding a device wafer 100-2 or 100-3 to a carrier wafer 200, according to embodiments of the inventive concept. In order to simplify the drawings, the first and second magnetic materials 160 and 260 are illustrated in FIGS. 5A and 5B, and other elements, e.g., an external connection terminal and a TSV, are not illustrated in FIGS. 5A and 5B.

Referring to FIG. 5A, unlike in FIGS. 4A and 4B, an edge portion A of the device wafer 100-2 may be removed through a cutting before bonding the device wafer 100-2 to the carrier wafer 200. The device wafer 100-2 from which the edge portion A was removed may be bonded to the carrier wafer 200 by using an adhesive member (not shown) and the first and second magnetic materials 160 and 260, like in FIG. 1C.

By using the process of FIG. 5A, the device wafer 100-2 and the carrier wafer 200 may be accurately aligned and bonded to each other through the first and second magnetic materials 160 and 260, similar to the process of FIGS. 4A and 4B, and thus, damage to the device wafer 100-2 may be prevented. In addition, as the edge portion A of the device wafer 100-2 is removed, damage to the device wafer 100-2 may be minimized in a back grinding process and subsequent processes.

Referring to FIG. 5B, an entire edge portion B of the device wafer 100-3 may be removed by cutting, unlike in the device wafer 100-2 of FIG. 5A. That is, in the device wafer 100-2 of FIG. 5A, only a lower portion of the edge portion A is removed and an upper portion of the edge portion A is maintained. However, in the device wafer 100-3 of FIG. 5B, the entire edge portion B is removed and thus the side of the edge portion B makes a predetermined angle θ with the back side F2.

The device wafer 100-3 from which the edge portion B was removed may be bonded to the carrier wafer 200 by using the adhesive member (not shown) and the first and second magnetic materials 160 and 260, like in FIG. 1C. By using the process of FIG. 5B, the device wafer 100-3 and the carrier wafer 200 may be accurately aligned and bonded to each other through the first and second magnetic materials 160 and 260, and thus, damage to the device wafer 100-3 may be prevented. In addition, as the edge portion B of the device wafer 100-3 is removed, damage, such as chipping, cracks, and breaks of the device wafer 100-3, may be minimized in a back grinding process and subsequent processes.

Figure 6:
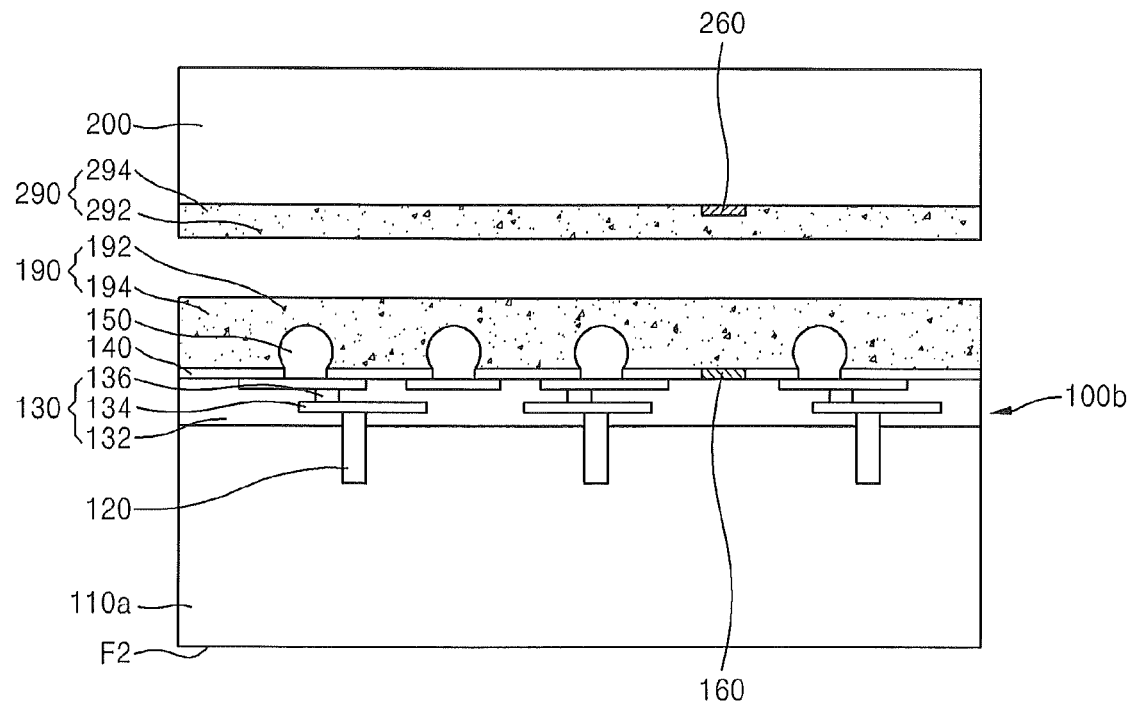
FIG. 6 is a cross-sectional view illustrating a process of bonding a device wafer to a carrier wafer, according to another embodiment of the inventive concept.

FIG. 6 is a cross-sectional view illustrating a process of bonding a device wafer 100b to a carrier wafer 200, according to another embodiment of the inventive concept.

Referring to FIG. 6, a first adhesive member 190 may be coated on a passivation layer 140 of the device wafer 100b to cover a first magnetic material 160 and an external connection terminal 150. The first adhesive member 190 may include an adhesive material 192 and magnetic particles 194. In addition, a second adhesive member 290 may be coated on the carrier wafer 200 to cover a second magnetic material 260. The second adhesive member 290 may also include an adhesive material 292 and magnetic particles 294.

The adhesive materials 192 and 292 may include polymer material having adhesive properties. For example, the adhesive materials 192 and 292 may be liquid-type materials in which the magnetic particles 194 and 294 may be dispersed, and may include a resin for UV curing or a resist. The magnetic particles 194 and 294 may be obtained by pulverizing a magnetic material, and may be formed of Nd powder or ferrite powder.

The first adhesive member 190 and the second adhesive member 290 may be magnetized so that a surface of the first adhesive member 190 and a surface of the second adhesive member 290, which face each other, have opposite polarities. For example, the first adhesive member 190 and the second adhesive member 290 may be magnetized by applying a magnetic field to each of the first and second adhesive members 190 and 290 through a magnetic plate, so that a surface of the first adhesive member 190 and a surface of the second adhesive member 290, which face each other, may have opposite polarities. Furthermore, in order to increase a bonding strength by a magnetic force, a polarity direction of the first adhesive member 190 may be the same as that of the first magnetic material 160, and a polarity direction of the second adhesive member 290 may be the same as that of the second magnetic material 260.

In the process of FIG. 6, the first and second adhesive members 190 and 290 for bonding the device wafer 100b to the carrier wafer 200 have magnetism, and thus, the bonding strength may be improved and the device wafer 100b and the carrier wafer 200 may be accurately aligned and bonded to each other due to the directivity of the magnetic force.

Figure 7:
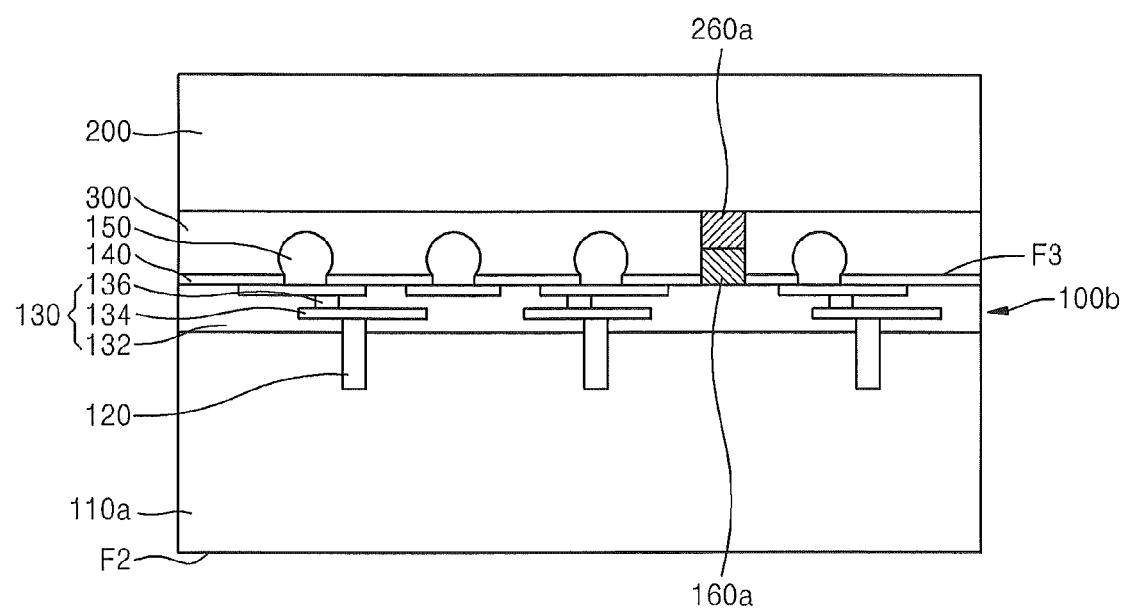
FIG. 7 is a cross-sectional view illustrating a process of bonding a device wafer to a carrier wafer, according to another embodiment of the inventive concept.

FIG. 7 is a cross-sectional view illustrating a process of bonding a device wafer 100b to a carrier wafer 200, according to another embodiment of the inventive concept.

Referring to FIG. 7, a first magnetic material 160a and a second magnetic material 260a may contact each other after the device wafer 100b and the carrier wafer 200 are bonded to each other. At least one of the first and second magnetic materials 160a and 260a may have a relatively high height.

For example, the height of the first magnetic material 160a or the height of the second magnetic material 260a may be greater than that of the external connection terminal 150. Alternatively, as illustrated in FIG. 7, the height of the first magnetic material 160a and the height of the second magnetic material 260a may be each less than that of the external connection terminal 150, but a height obtained by adding the height of the first magnetic material 160a and the height of the second magnetic material 260a may be greater than that of the external connection terminal 150.

In this manner, since the first magnetic material 160a and the second magnetic material 260a directly contact each other and are bonded to each other, a bonding strength may be improved and the device wafer 100b and the carrier wafer 200 may be accurately aligned and bonded to each other.

FIG. 8A through 8D are cross-sectional views illustrating, in detail, processes of grinding the back side of the device wafer 100b of FIG. 1D, according to an embodiment of the inventive concept.

Figure 8A:
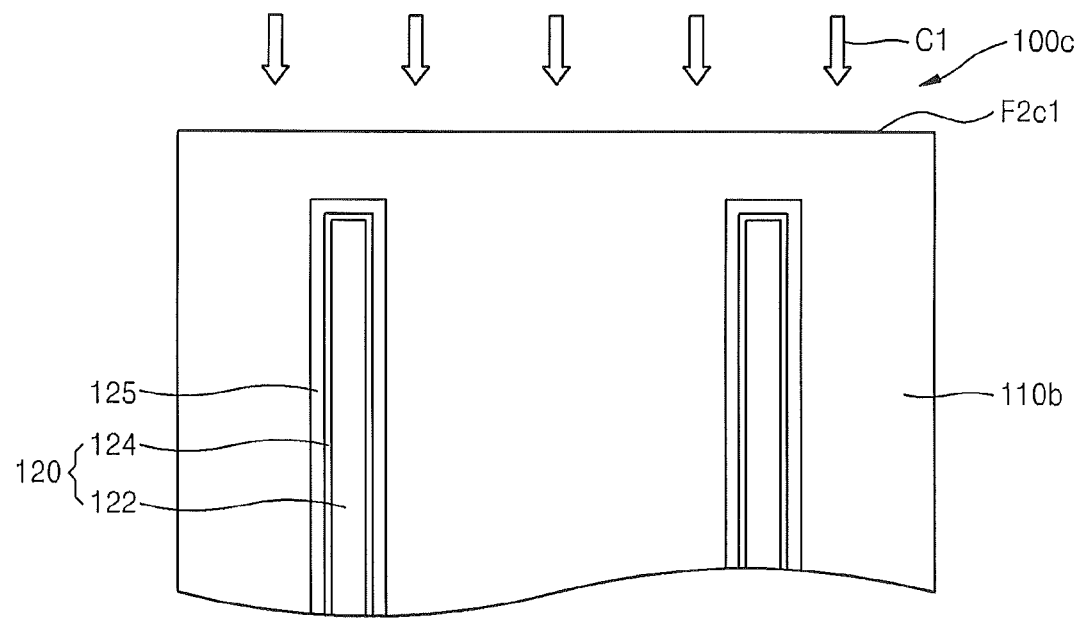
FIGS. 8A through 8D are cross-sectional views illustrating, in more detail, a process of back grinding the back side of a device wafer of FIG. 1D.

Referring to FIG. 8A, after bonding the device wafer 100b to the carrier wafer 200, as shown in FIG. 1C, a first CMP process (see C1) is performed on the device wafer 100c, and a back side F2c1 of the device wafer 100c, i.e., the back side of a body layer 110b, is ground to make the device wafer 100c thin. However, the TSV 120 is not exposed on the back side F2c1 of the device wafer 100c by the first CMP process. If the TSV 120 is directly exposed on the back side F2c1 through the first CMP process, a metal material included in the TSV 120 may contaminate a silicon layer of the device wafer 100c.

Figure 8B:
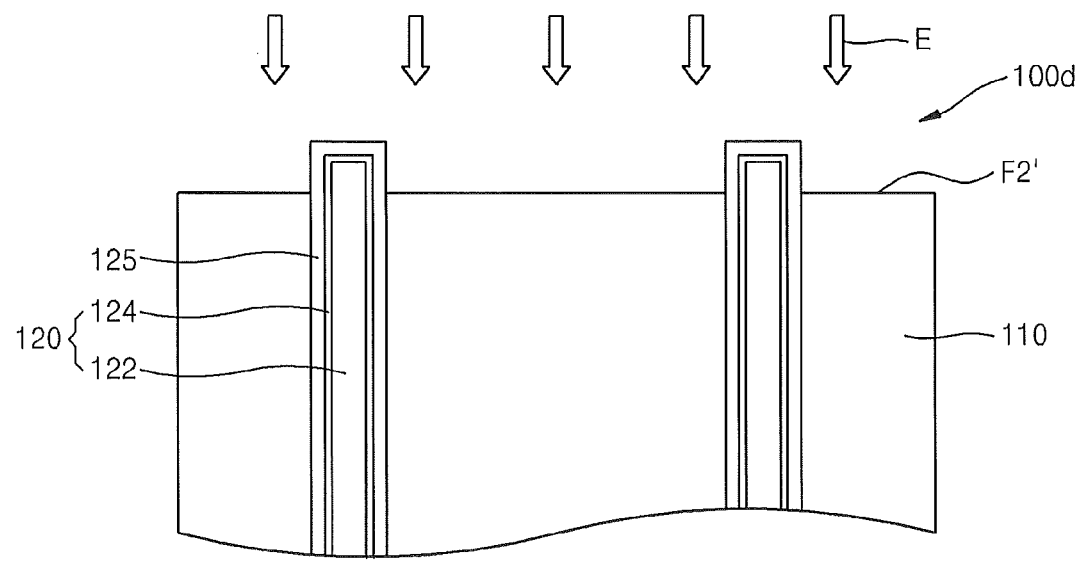

Referring to FIG. 8B, after performing the first CMP process, an etching process (see E) is performed on the device wafer 100c. The etching process may be a dry etching process. However, if necessary, a wet etching process may be performed instead of the dry etching process. The dry etching process may be performed by using an etchant having a relatively large etching selection ratio with respect to a spacer insulating layer 125. For example, the dry etching process may be performed by using an etchant that has a relatively high etching speed with respect to silicon and has a relatively low etching speed with respect to the spacer insulating layer 125.

Through the etching process, the TSV 120 and the spacer insulating layer 125 may protrude onto a back side F2' of the device wafer 100d, i.e., the back side of a body layer 110. Since only a silicon layer of the device wafer 100d is removed through the etching process, the TSV 120 and the spacer insulating layer 125 may protrude at the back side F2' of the device wafer 100d while maintaining a form in which the TSV 120 is surrounded by the spacer insulating layer 125.

Figure 8C:
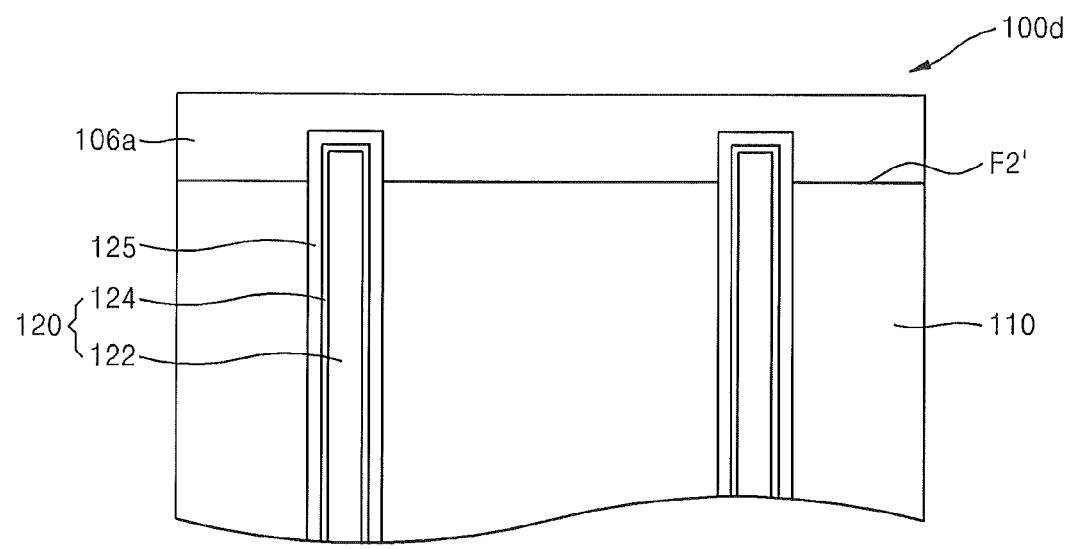

Referring to FIG. 8C, after performing the etching process, a first protective layer 106a is formed to cover the TSV 120 and the spacer insulating layer 125, which protrude at the back side F2' of the device wafer 100d. The first protective layer 106a may be formed of an oxide film and/or a nitride film to cover the upper surface of the spacer insulating layer 125. The first protective layer 106a may be formed of a $SiO_2$ film by using an HDP-CVD process.

Figure 8D:
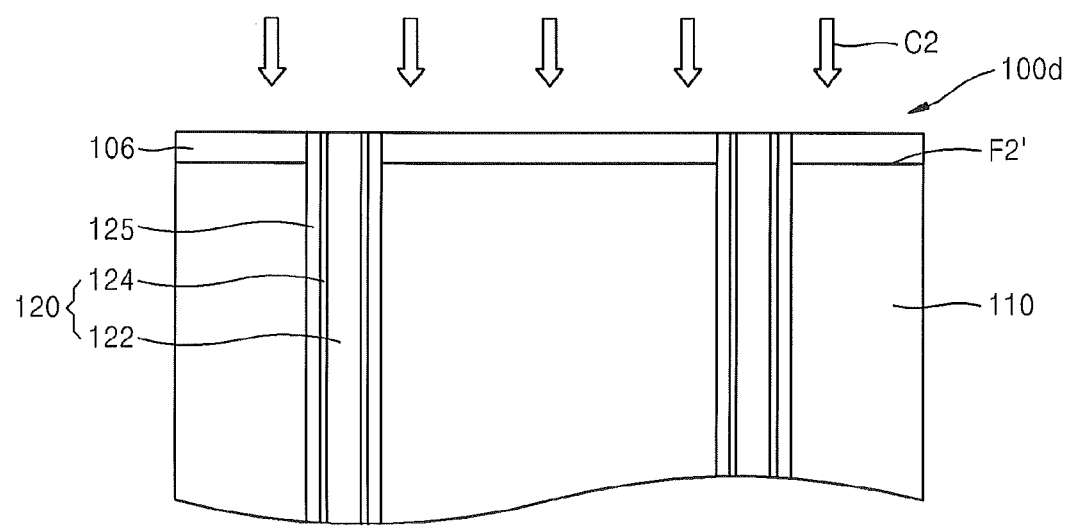

Referring to FIG. 8D, after forming the first protective layer 106a, a second CMP process (see C2) is performed to expose the TSV 120. The TSV 120 may be exposed out of the spacer insulating layer 125 through the second CMP process. Thus, only sides of the TSV 120 are surrounded by the spacer insulating layer 125, and an upper surface of the TSV 120 is exposed and may be flush with an upper surface of the spacer insulating layer 125 and an upper surface of a first protective layer 106.

Since the second CMP process is performed in a state in which the back side F2' of the device wafer 100d is covered by the first protective layer 106, a silicon layer of the device wafer 100d may not be contaminated although a metal material of the TSV 120 is exposed. After performing the second CMP process, a process of forming the redistribution line 170 that is connected to the TSV 120 may be performed, as shown in FIG. 1E.

FIG. 9 is a cross-sectional view illustrating a process of separating a device wafer 100 from a carrier wafer 200, according to an embodiment of the inventive concept.

In FIG. 1F, a magnetic force of opposite polarity is applied through the magnetic plate 400 to separate the carrier wafer 200 from the device wafer 100. However, in the present embodiment of FIG. 9, the magnetic plate 400 is not used and heat is used to separate the carrier wafer 200 from the device wafer 100.

In more detail, a ferromagnetic substance such as a magnet loses magnetism thereof when heated above a predetermined temperature. A temperature at which a ferromagnetic substance is changed from a ferromagnetic state into a paramagnetic state is referred to as the Curie temperature. For example, the Curie temperature of magnetite is about 575° C., the Curie temperature of hematite is about 675° C., and the Curie temperature of pure iron is about 768° C. The Curie temperature of nickel is about 350° C., and the Curie temperature of cobalt is about 1120° C.

The Curie temperature may be somewhat changed when the material of a magnet is adjusted and is turned into a powder state. For example, ferrite is a sintered oxide-based magnetic material having a composition of $A_xB_{(1-x)}Fe_2O_4$ (wherein "A" is Ni, Mg, Zn, or Cd and "B" is Mn, Ni, or Co). In a ferrite that is used in general communication devices, the Curie temperature is in a relatively high temperature range. However, in a thermo sensitive ferrite, a material composition may be adjusted so that the Curie temperature is in the range of about −50° C. to about 300° C. Thus, by appropriately adjusting the material composition, a magnetic material having a target Curie temperature may be manufactured.

In the process of FIG. 9, first and second magnetic materials 160 and 260 may have the Curie temperature that is equal to or less than about 200° C. In some cases, the first and second magnetic materials 160 and 260 may have the Curie temperature that is equal to or less than about 100° C. The device wafer 100 is bonded to the carrier wafer 200 by using the first and second magnetic materials 160 and 260 having a relatively low Curie temperature. After performing a back grinding process on the device wafer 100, the carrier wafer 200 may be easily separated from the device wafer 100 by applying a temperature, which is equal to or greater than the Curie temperature, to remove the magnetism of the first and second magnetic materials 160 and 260.

As illustrated in FIG. 9, heat may be applied toward the carrier wafer 200 to prevent damage to devices in the device wafer 100.

Figure 10:
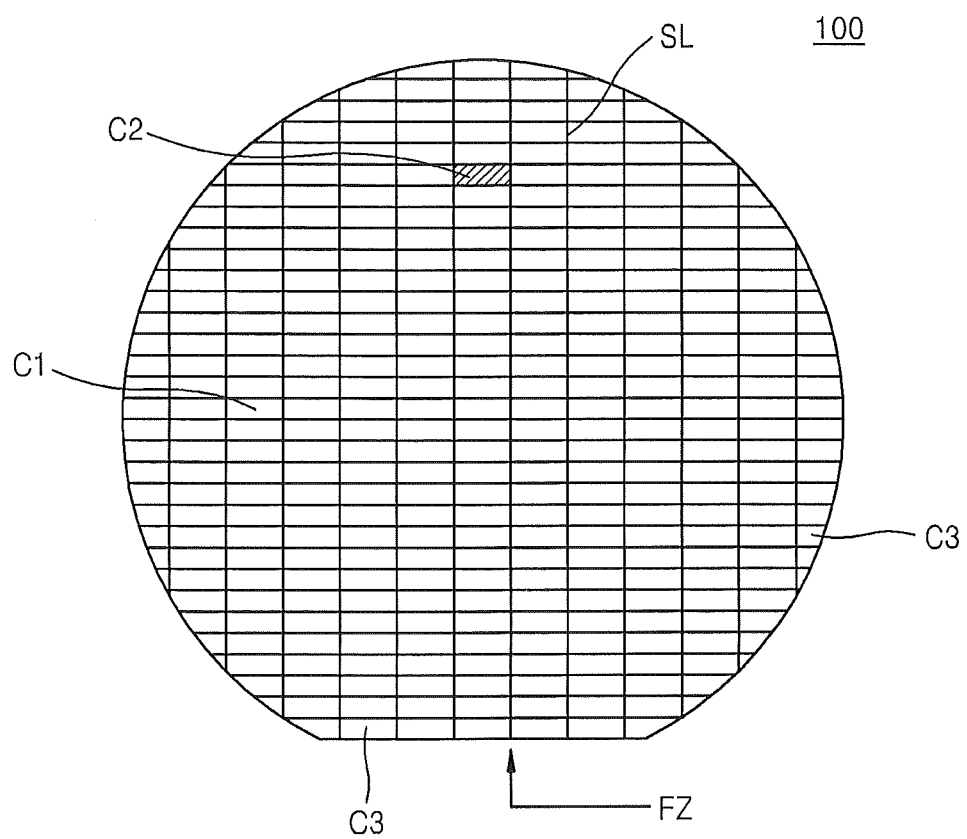
FIG. 10 is a plan view of a device wafer which shows a location where a magnetic material is disposed, according an embodiment of the inventive concept.
Figure 11:
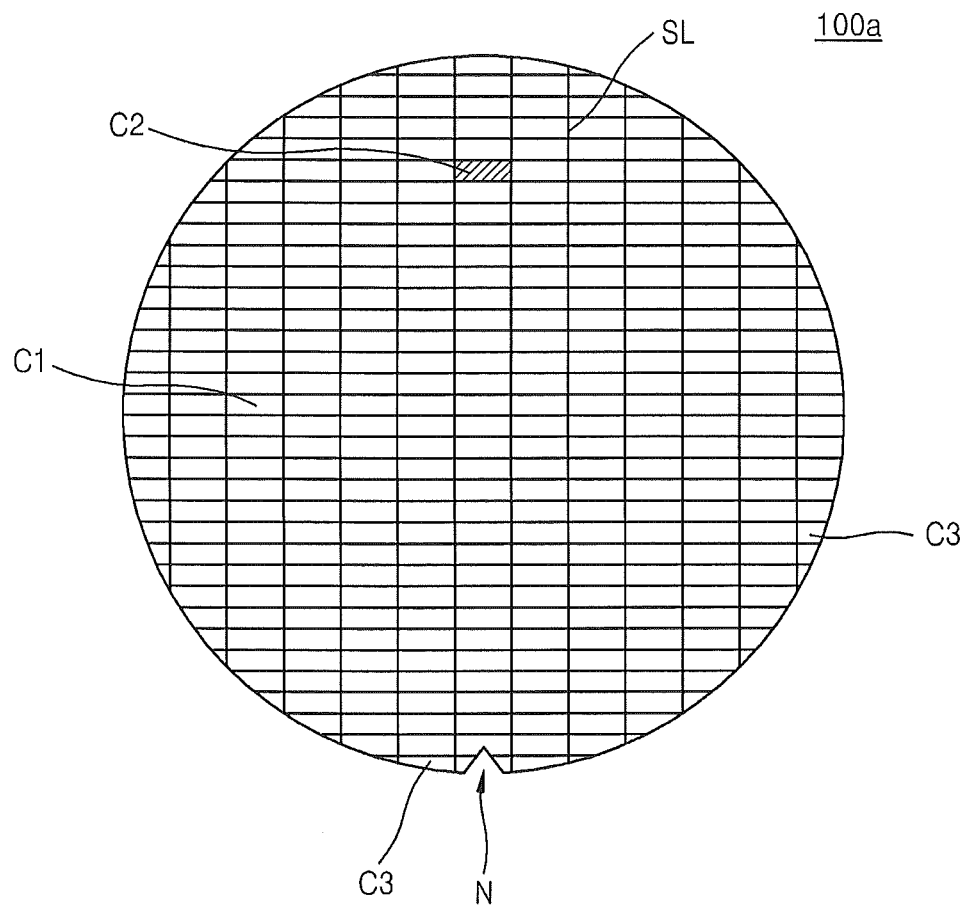
FIG. 11 is a plan view of a device wafer which shows a location where a magnetic material is disposed, according another embodiment of the inventive concept.

FIG. 10 is a plan view of a device wafer 100 which shows a location where a magnetic material is disposed, according an embodiment of the inventive concept, and FIG. 11 is a plan view of a device wafer 100a which shows a location where a magnetic material is disposed, according another embodiment of the inventive concept.

Referring to FIG. 10, the device wafer 100 may include a plurality of semiconductor chips each having a rectangular shape. As illustrated in FIG. 10, the device wafer 100 has a shape having a flat-zone or flat edge portion FZ. A device wafer may have a shape having a flat-zone FZ as illustrated in FIG. 10 or a shape having a notch as illustrated in FIG. 11. The plurality of semiconductor chips in the device wafer 100 may be distinguished from each other by a scribe lane SL, and may separated from each other by using a sawing process for sawing the scribe lane SL.

The plurality of semiconductor chips in the device wafer 100 may be classified into effective chips C1, test element groups (TEGs) C2, and edge chips C3. The effective chips C1 are chips that are packaged through a semiconductor packaging process and may be disposed mainly in the inside area of the device wafer 100. The TEGs C2 may be used for quality control during manufacturing processes, and may be chips specifically made in the device wafer 100. In most cases, the TEGs C2 are not disposed as chips of the device wafer 100, but are disposed so that elements of the TEGs C2 are arranged in the scribe lane SL so as to increase the number of effective chips C1. The edge chips C3 denote unfinished chips disposed at an edge of the device wafer 100, and cause the loss of the device wafer 100. The edge chips C3 may include areas in which a full shot may not be performed in a photography process.

The flat-zone FZ is a flattened portion in the device wafer 100 to identify the structure of the device wafer 100. Chips around the flat-zone FZ are also wasted chips corresponding to the edge chips C3.

The first magnetic material 160 described above may be disposed in the scribe lane SL of the device wafer 100 or chips of an edge area of the device wafer 100. The edge area of the device wafer 100 may include edge chips C3 disposed along the edge of the device wafer 100 or edge chips C3 around the flat-zone FZ. Since the scribe lane SL or the edge chips C3 corresponds to a wasted area, no problem is presented when a magnetic material is disposed in the scribe lane SL or the edge chips C3.

Referring to FIG. 11, the device wafer 100a may have a shape having a notch N. Also in the notch-type device wafer 100a, the first magnetic material 160 may be disposed in the scribe lane SL of the device wafer 100a or chips of an edge area of the device wafer 100a. The edge portion of the device wafer 100a may include edge chips C3 around the notch N instead of edge chips around the flat-zone FZ shown in FIG. 10.

Figure 12:
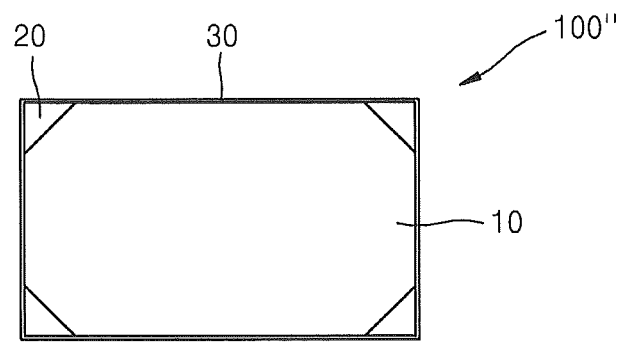
FIG. 12 is a plan view of a semiconductor chip which shows a location where a magnetic material is disposed on the semiconductor chip, according an embodiment of the inventive concept.

FIG. 12 is a plan view of a semiconductor chip 100" which shows a location where a magnetic material is disposed on the semiconductor chip 100", according an embodiment of the inventive concept.

Referring to FIG. 12, the semiconductor chip 100" may include an effective area 10, a crack stop area 30, and a chamfer area 20. The crack stop area 30 is an area for preventing a crack of the semiconductor chip 100", and the chamfer area 20 is an area for rounding corners of the semiconductor chip 100" through chamfer cutting. Although in FIG. 12, the chamfer area 20 is around vertexes of the semiconductor chip 100" having a tetragonal shape, the inventive concept is not limited thereto. For example, the chamfer area 20 may be around the sides of the semiconductor chip 100".

Integrated circuits are not formed in the crack stop area 30 and the chamfer area 20. Thus, a magnetic material may be disposed in the crack stop area 30 or the chamfer area 20. The magnetic material may be formed of a material having a relatively weak magnetism or a paramagnetic material in consideration of a case in which the magnetic material is not removed, and thus, an electromagnetic effect that has influence on circuit devices in the semiconductor chip 100" may be minimized.

While the inventive concept has been particularly shown and described with reference to exemplary embodiments thereof, it will be understood that various changes in form and details may be made therein without departing from the spirit and scope of the following claims.

What is claimed is:

1. A wafer processing method comprising:
disposing a first magnetic material on a front side of a wafer and disposing a second magnetic material on a carrier wafer, wherein an outwardly facing surface of the first magnetic material and an outwardly facing surface of the second magnetic material have opposite polarities;
positioning the wafer and the carrier wafer relative to one another such that the outwardly facing surface of the first magnetic material faces the outwardly facing surface of the second magnetic material;
aligning and bonding the wafer to the carrier wafer by magnetic attraction between the first magnetic material and the second magnetic material;
grinding a back side of the wafer to make the wafer thin; and
separating the wafer from the carrier wafer.

2. The method of claim 1, wherein the wafer comprises a through silicon via (TSV), and grinding the back side of the wafer comprises exposing the TSV at the back side of the wafer.

3. The method of claim 1, wherein the wafer comprises a through silicon via (TSV) that is insulated from a silicon layer of the wafer by an insulating layer, and wherein grinding the back side of the wafer comprises:
removing a portion of the back side of the wafer by using chemical mechanical polishing (CMP);
etching the back side of the wafer to expose the insulating layer;
forming a protective layer on the back side of the wafer to cover the insulating layer; and
removing the protective layer and the insulating layer by using CMP to expose the TSV.

4. The method of claim 1, wherein separating the wafer from the carrier wafer comprises separating the wafer from the carrier wafer by using a magnetic repulsive force that is generated by applying a magnetic field having the same polarity as the polarity of one of the outwardly facing surfaces of the first and second magnetic materials.

5. The method of claim 1, wherein separating the wafer from the carrier wafer comprises heating the wafer and the carrier wafer above a temperature for removing a magnetism of at least one of the first and second magnetic materials.

6. The method of claim 1, wherein the first magnetic material is disposed on a first portion of the wafer where effective chips are not disposed, and the second magnetic material is disposed on a first portion of the carrier wafer which corresponds to the first portion of the wafer.

7. The method of claim 6, wherein the first portion of the wafer comprises at least one of a scribe lane, a notch, a flat-zone, and an edge portion of the wafer, wherein the first magnetic material comprises a plurality of magnetic materials that are disposed in the first portion of the wafer and the second magnetic material comprises a plurality of magnetic materials that are disposed in the first portion of the carrier wafer, and wherein the number of plurality of magnetic materials of the first magnetic material is the same as the number of plurality of magnetic materials of the second magnetic material.

8. The method of claim 1, wherein the wafer comprises a through silicon via (TSV), grinding the back side of the wafer comprises exposing the TSV, and wherein the method further comprises forming a redistribution line, which is connected to the TSV, before separating the wafer from the carrier wafer.

9. The method of claim 1, wherein before disposing the first magnetic material on the wafer and disposing the second magnetic material on the carrier wafer, the method further comprises forming a through silicon via (TSV) in the wafer and disposing an external connection terminal, which is connected to the TSV, on a front side of the wafer, and wherein aligning and bonding the wafer to the carrier wafer comprises bonding the wafer to the carrier wafer by using the magnetic attraction and an adhesive member covering the external connection terminal.

10. The method of claim 9, wherein forming the TSV in the wafer comprises forming the TSV by using any one of a via first process, a via middle process, and a via last process.

11. The method of claim 1, wherein the first and second magnetic materials are formed of at least one of a ferromagnetic material, a paramagnetic material, and a ferromagnetic material.

12. The method of claim 1, wherein the first magnetic material is disposed in a crack stop area or a chamfer area in an effective chip of the wafer.

13. A method of manufacturing a semiconductor device, the method comprising:
    forming a through silicon via (TSV) in a wafer;
    disposing an external connection terminal, which is connected to the TSV, on a front side of the wafer;
    disposing a first magnetic material on the front side of the wafer and disposing a second magnetic material on a carrier wafer, wherein an outwardly facing surface of the first magnetic material and an outwardly facing surface of the second magnetic material have opposite polarities;
    positioning the wafer and the carrier wafer relative to one another such that the outwardly facing surface of the first magnetic material faces the outwardly facing surface of the second magnetic material;
    aligning and bonding the wafer to the carrier wafer by using an adhesive member that covers the external connection terminal and a magnetic attraction between the first magnetic material and the second magnetic material;
    grinding a back side of the wafer to make the wafer thin and to expose the TSV;
    forming a redistribution line, which is connected to the TSV, on the back side of the wafer;
    separating the wafer from the carrier wafer; and
    dividing the wafer into a plurality of semiconductor devices.

14. The method of claim 13, wherein the first magnetic material is disposed in any one of a scribe lane of the wafer, a notch of the wafer, a flat-zone of the wafer, and an edge portion of the wafer, and wherein the method further comprises removing the first magnetic material while dividing the wafer into the plurality of semiconductor devices.

15. The method of claim 13, wherein separating the wafer from the wafer carrier comprises either: (i) separating the wafer from the carrier wafer by using a magnetic repulsive force, which is generated by applying a magnetic field having the same polarity as the polarity of one of the outwardly facing surfaces of the first and second magnetic materials, or (ii) heating the wafer and the carrier wafer above a temperature for removing a magnetism of at least one of the first and second magnetic materials.

16. A wafer processing method comprising:
    providing:
        a wafer having a through silicon via (TSV), the wafer including at least one first magnetic member on a front side of the wafer, the first magnetic member having an outwardly facing surface having a polarity;
        a carrier wafer including at least one second magnetic member on a front side of the carrier wafer, the second magnetic member having an outwardly facing surface having a polarity that is opposite the polarity of the outwardly facing surface of the first magnetic member;
    positioning the wafer and the carrier wafer relative to one another such that the front side of the wafer faces the front side of the carrier wafer;
    aligning and bonding the wafer to the carrier wafer by magnetic attraction between the first magnetic member and the second magnetic member;
    grinding a back side of the wafer to remove a portion of the wafer and to expose the TSV; and then
    separating the wafer from the carrier wafer.

17. The method of claim 16, wherein the wafer has a plurality of first magnetic members and the carrier wafer has a plurality of second magnetic members, and wherein aligning and bonding the wafer to the carrier wafer comprises aligning and bonding the wafer to the carrier wafer by magnetic attraction between corresponding ones of the first magnetic members and the second magnetic members.

18. The method of claim 16, wherein separating the wafer from the carrier wafer comprises separating the wafer from the carrier wafer using a magnetic repulsive force, which is generated by applying a magnetic field having the same polarity as the polarity of one of the outwardly facing surfaces of the first and second magnetic members.

19. The method of claim 16, wherein separating the wafer from the carrier wafer comprises heating the wafer and the carrier wafer above a temperature for removing a magnetism of at least one of the first and second magnetic materials.

20. The method of claim 16, wherein aligning and bonding the wafer to the carrier wafer comprises using an adhesive member that is positioned between the front side of the wafer and the front side of the carrier wafer.

* * * * *